US005523729A

United States Patent [19]
Nakai et al.

[11] Patent Number: 5,523,729
[45] Date of Patent: Jun. 4, 1996

[54] MULTILAYER BAND PASS FILTER WITH A ZERO POINT FORMING CAPACITOR

[75] Inventors: Shinya Nakai, Ichikawa; Hideaki Ninomiya, Narita; Hideaki Shimoda, Ichikawa, all of Japan

[73] Assignee: TDK Corporation, Tokyo, Japan

[21] Appl. No.: 190,321

[22] Filed: Nov. 19, 1993

[30] Foreign Application Priority Data

Nov. 19, 1992 [JP] Japan ................................. 4-333690
Nov. 26, 1992 [JP] Japan ................................. 4-339596
Dec. 14, 1992 [JP] Japan ................................. 4-353631
Apr. 1, 1993 [JP] Japan ................................. 5-098893

[51] Int. Cl.$^6$ ........................ H03H 7/07; H03H 7/09
[52] U.S. Cl. ............................. 333/177; 333/185
[58] Field of Search ............................ 333/202, 204, 333/205, 219, 177, 175, 185, 167

[56] References Cited

U.S. PATENT DOCUMENTS 5,140,497 8/1992 Kato et al. ..................... 333/202 X

FOREIGN PATENT DOCUMENTS 0071710 3/1991 Japan ..................................... 333/185
3-265205 11/1991 Japan .
0262313 11/1991 Japan ..................................... 333/178

Primary Examiner—Benny Lee
Assistant Examiner—Justin P. Bettendorf
Attorney, Agent, or Firm—Cushman, Darby & Cushman

[57] ABSTRACT

A multilayer band pass filter includes a zero point forming capacitor formed by a plurality of capacitors connected in series between first and second extension electrodes, and intermediate capacitors connected between each pair of adjacent series capacitors and the open end of a core conductor. Therefore, zero points can be formed at the lower and upper limits of a given band. The capacity of these capacitors is adjustable via extension electrodes which extend outside the baked ceramic casing, thereby allowing adjustment to be made to the zero point.

12 Claims, 26 Drawing Sheets

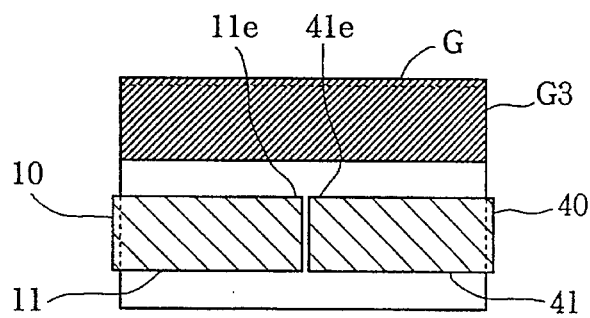
FIG. 3E S4
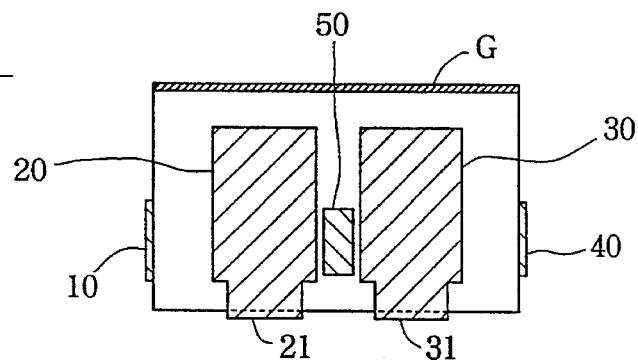
FIG. 3D S3
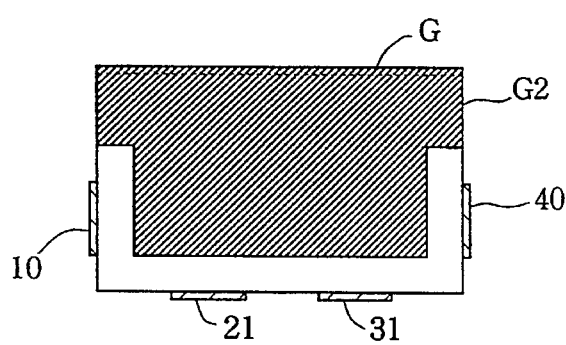
FIG. 3C S2
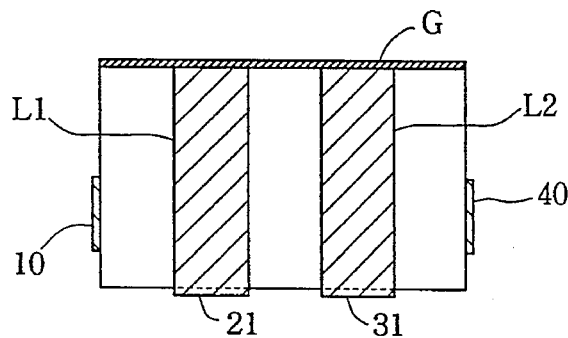
FIG. 3B S1
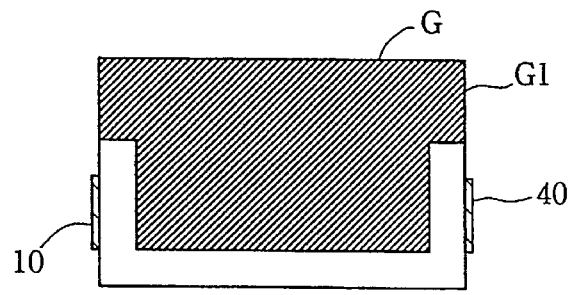
FIG. 3A S0

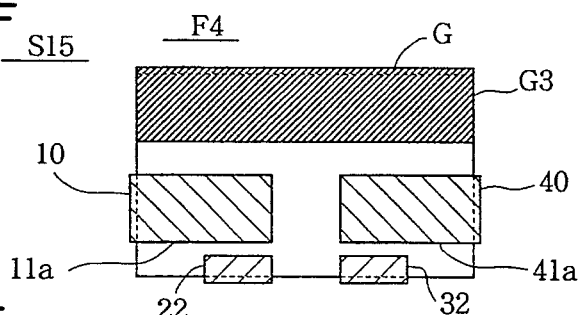
FIG. 12F S15
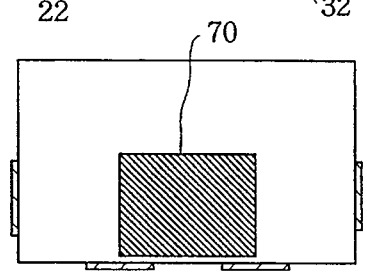
FIG. 12E S14
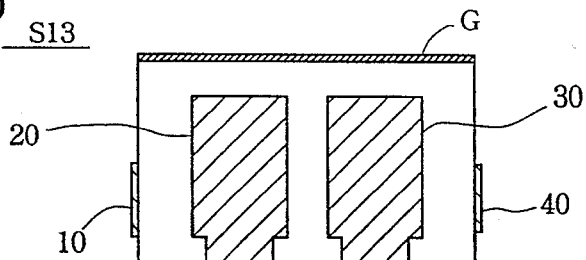
FIG. 12D S13
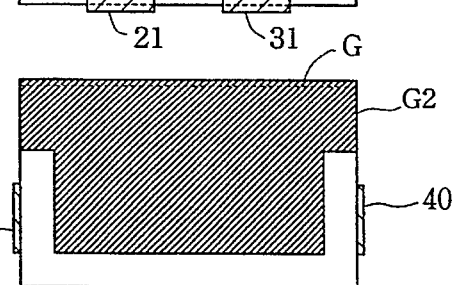
FIG. 12C S12
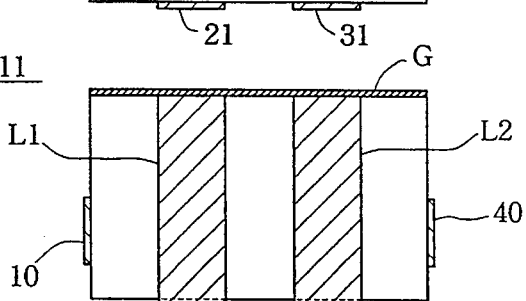
FIG. 12B S11
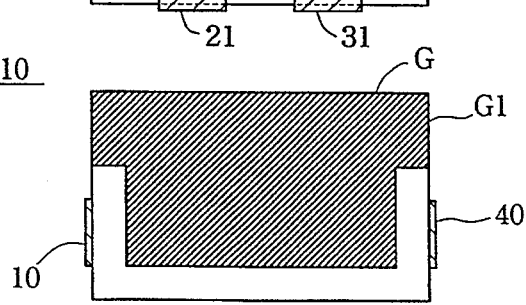
FIG. 12A S10

FIG. 13A
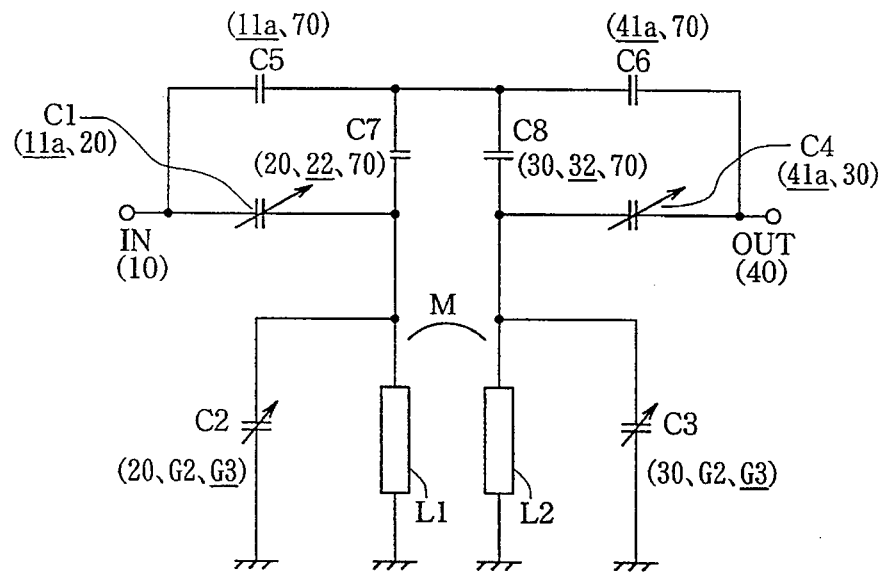
FIG. 13B
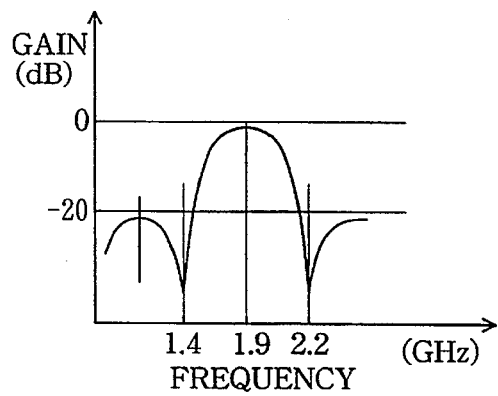
FIG. 14    S14
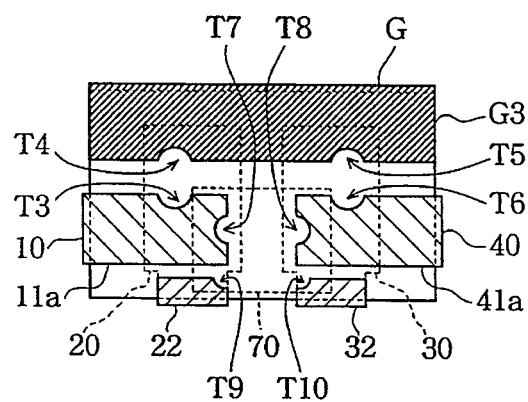

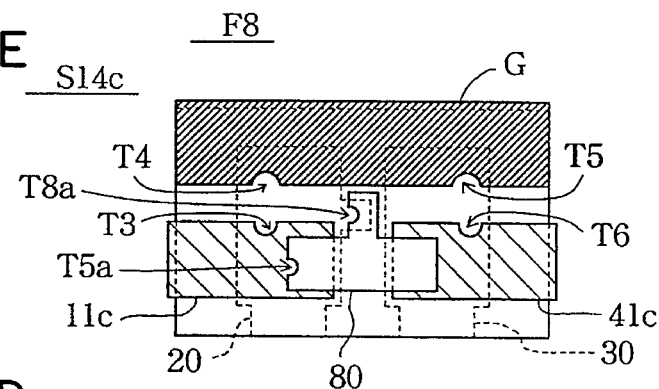
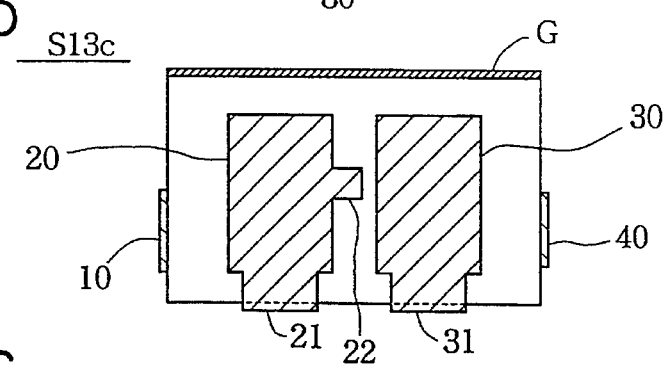
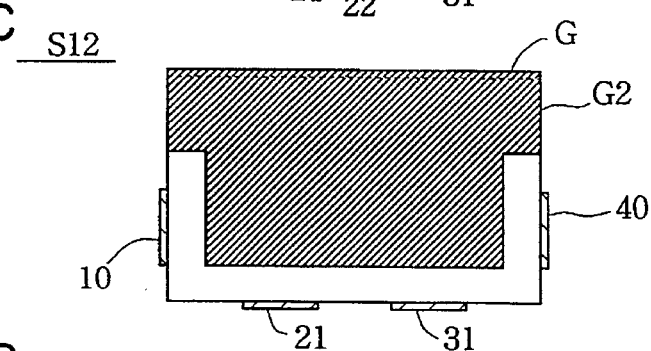
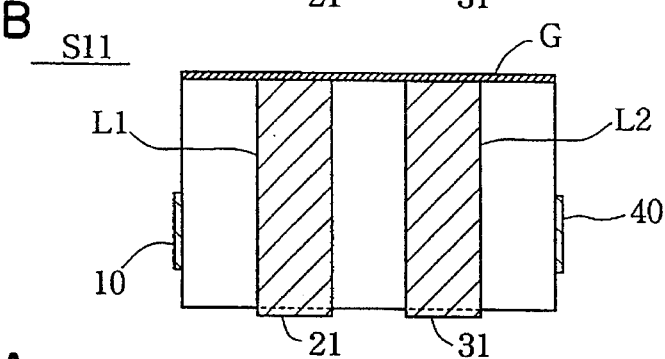
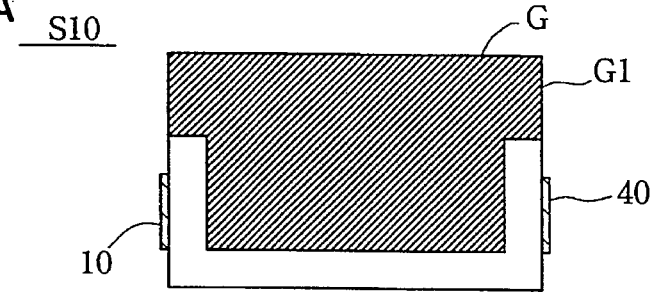

FIG. 2 5

| THICKNESS OF TIN FILM | AREA (mm²) | INPUT TERMINAL PART (210, 211) | OUTPUT TERMINAL PART (240, 241) | GROUND ELECTRODE PART (G201, G202, G203) |
|---|---|---|---|---|
| | | 4.5 | 4.5 | 37 |
| BEFORE FORMATION OF SMALL-GATE WIRES (μm) | | 4.0 | 4.3 | 20.0 |
| AFTER FORMATION OF SMALL-GATE WIRES (μm) | | 4.4 | 4.2 | 4.9 |

MULTILAYER BAND PASS FILTER WITH A ZERO POINT FORMING CAPACITOR

BACKGROUND OF THE INVENTION

1. Technical Field

The present invention relates to a multilayer band pass filter suitable for use in mobile communication instruments such as portable telephones, cordless telephones and the like, the multilayer band pass filter comprising a plurality of deposited dielectric layers made of ceramics or the like, a core conductor forming an inductor between each pair of adjacent dielectric layers or on each dielectric layer, and electrodes forming a capacitor.

2. Background Information

One conventional multilayer, band pass filter is described in Japanese Patent Laid-Open No. Hei 3-265205.

Such a deposited layer type band pass filter comprises a first ceramics layer, a core conductor, a second ceramics layer, a zero point forming capacitor electrode, a third ceramics layer, first electrodes, a fourth ceramics layer, second electrodes, a fifth ceramics layer and shield electrodes, each of which being deposited in the described order starting from the lowermost layer. The multilayer band pass filter also comprises a pair of input/output terminals formed at opposing sides therein. Each of the input/output terminals is connected to one of the two first electrodes. The first and second electrodes oppose each other having the forth ceramics layer positioned therebetween to form an input/output capacitor. The ends of the second electrodes are respectively connected to the open ends of the core conductors through other side electrodes. The second electrodes are positioned opposing the shield electrodes through the fifth ceramics layer to form resonance capacitors, each of which being connected in parallel to the corresponding core conductor.

The first electrodes both on the input and output sides are arranged opposite to the zero point forming capacitor electrode to form a zero point forming capacitor. The zero point forming capacitor provides a kind of trap circuit which has a given frequency to control a disturbing signal from any adjacent channel or unnecessary radiations at the zero point ($fn_1$). In the prior art, the zero point forming capacitor is entirely enclosed by ceramics.

On manufacturing such a multilayer band pass filter, there are produced manufacturing variabilities in the area of the zero point forming capacitor electrode, the area of the first electrodes, the distance between the adjacent electrodes, the dielectric constant of the ceramics and other factors. The manufacturing variabilities result in a variability in the capacity of the zero point forming capacitor. This in turn results in variabilities in the characteristics of the multilayer band pass filter, such as deviation of zero point frequency, less reduction of zero point level and other factors.

In the prior art, it is practically impossible to regulate the capacity of the zero point forming capacitor after the multilayer band pass filter has been baked. More particularly, the main factors for changing the capacity of the zero point forming capacitor are the area of the opposed faces in the zero point forming capacitor electrode and the first electrodes, the distance between the adjacent electrodes and the dielectric constant in the ceramics. However, the zero point forming capacitor electrodes cannot be trimmed since it is enclosed by the ceramics layers. The necessary parts of the first electrodes cannot be trimmed either since the faces of the first electrodes opposite to the zero point forming capacitor electrode are similarly enclosed by the ceramics layers. Thus, the area of the opposed faces in the zero point forming capacitor electrode and the first electrodes cannot be changed. Further, the distance between the zero point forming capacitor electrode and the first electrodes, as well as the dielectric constant in the ceramics layers, cannot be changed after the multilayer band pass filter has been baked. In the prior art, therefore, the capacity of the zero point forming capacitor cannot be regulated after the multilayer band pass filter has been baked. This is true of the regulation of the other internal capacitors.

The problems mentioned above are similarly raised by multilayer band pass filters other than the multilayer band pass filter.

FIGS. 22A and 22B show one example of the multilayer band pass filters constructed in accordance with the prior art. FIG. 22A is a longitudinal cross-section of the multilayer band pass filter, while FIG. 22B is a right-hand side view of the multilayer band pass filter. Namely, FIG. 22A is a view as viewed along a line I—I from a direction or arrow in FIG. 22B. In FIG. 22B, the soldering parts will be omitted.

The multilayer band pass filter F103 of the prior art shown in FIGS. 22A–22B comprises a resonance circuit consisted of an inductor and a resonance capacitor. The inductor is formed by a core conductor 110 while the resonance capacitor is formed by a resonance capacitor electrode 120, a ground electrode 121 and ceramics 130. The open end 111 of the core conductor 110 is connected to the electrode end portion 120e of the resonance capacitor electrode 120 through a connecting surface electrode 140. The connecting surface electrode 140 is provided on the surface (side) 130 of the multilayer band pass filter F103. The short-circuit end 112 of the core conductor 110 and the ground electrode 121 are connected to another ground electrode 122 which is formed on the surface of the filter F103. A ground pattern 151 is formed on a mother board 150 and connected to the ground electrode 122 through a soldering part.

On production of the filter F103, some thin green sheet (ceramics before baked) are deposited to form a sub-assembly. An electrically conductive paste is printed to form the core conductor 110 over which a green sheet is deposited. Over this green sheet, an electrically conductive paste is printed to form the resonance capacitor electrode 120 over which a green sheet is deposited to form a final assembly. An electrically conductive paste (silver paste) forming the connecting surface electrode 140 and ground electrode 122 is transferred and printed on the final assembly after it has been baked.

Before the conductive paste for the connecting surface electrode 140 is to be transferred and printed onto the filter F103, a drum having a longitudinally extending groove formed therein is provided, and the conductive paste is filled in the groove. The filter F103 is carried to, and positioned at, a location where the face of the filter F103 in which the connecting surface electrode 140 is to be formed opposes the filled groove. Thereafter, the transferring and printing step will be carried out. The connecting surface electrode 140 is formed to extend on the face 131 of the filter F103 from the uppermost end thereof to the lower end 141.

FIG. 23 is a view showing an equivalent circuit in the aforementioned structure of the prior art.

A resonance circuit is defined by an inductor L101 and a resonance capacitor C101, and another resonance circuit is formed by an inductor L102 and a resonance capacitor C102. The inductor L101 is formed by the core conductor 110. The resonance capacitor C101 is formed by the resonance capacitor electrode 120, the ground electrode 121 and the ceramics 130. The inductor L102 and resonance capacitor C102 are formed in the similar manner. In FIGS. 22A–22B, the structure relating to input/output capacitors C103 and C104 will be omitted.

In the prior art, the band pass filter F103 is fixed to the mother board 150 through soldering, but the connecting surface electrode 140 is not connected to the pattern on the mother board 150. The lower end 141 of the connecting surface electrode 140 is separated from the pattern of the mother board 150. If a ground pattern 152 exists near the lower end 141 of the connecting surface electrode 140, capacitors C105 and C106, as shown in FIG. 23, will be formed between the lower end 141 of the connecting surface electrode 140 and the ground pattern 152. Capacitors C105 and C106 cause the resonance point (resonance frequency) in the resonance circuit to be changed. In addition, if a wiring pattern, through which signals pass, exists near the lower end 141 of the electrode, any unnecessary coupling will be created to disturb the operation of the entire system.

Therefore, the prior art requires that when the band pass filter F103 is to be mounted on the mother board 150, the wiring patterns such as ground pattern and other patterns are located remote from the lower end 141 of the connecting surface electrode 140. This makes the design of circuit cumbersome.

The problems mentioned above are also raised by filters other than the band pass filter.

The present invention has an object to provide a multilayer band pass filter comprising an extension electrode connected to an input/output terminal, a capacitor electrode arranged opposed to the extension electrode through ceramics to form an input/output capacitor, core conductors forming an inductor, the open end of which is connected to the capacitor electrode, a ground electrode positioned opposite to the capacitor electrode to from a resonance capacitor with the zero point forming capacitor, whereby the capacity of the zero point forming capacitor can be regulated after the multilayer band pass filter has been baked.

The present invention has another object to provide a multilayer band pass filter and filter circuit comprising first and second extension electrodes respectively connected to two input/output terminals, a capacitor electrode arranged opposed to the first and second extension electrodes through dielectric to form first and second input/output capacitors, core conductors forming an inductor, the open end of which is connected to the capacitor electrode, a ground electrode connected to the capacitor electrode to form a resonance capacitor therebetween, and a zero point forming capacitor, whereby zero points can be formed below and above a given range.

The present invention has still another object to provide a multilayer filter which can cause the resonance point in the resonance circuit to be influenced by the wiring patterns on the mother board, and which can prevent the operation of the entire system from be disturbed by any unnecessary coupling with the wiring pattern through which signals pass.

The present invention has a further object to provide a filter and a method of producing such a filter, where the plated film thickness of the filter is substantially uniform even when electrodes which are to be electrically plated are different in area from one another.

Preferably, the multilayer band pass filter comprises a plurality of resonance circuits each of which comprising an inductor formed by a core conductor and a resonance capacitor. The resonance capacitor comprises an internal electrode connected to the core conductor, and an internal ground electrode formed by internal layers and ceramics. In order to reduce the band in the band pass filter, the thickness of the ceramics between the ground electrodes formed on the upper and lower faces of the multilayer band pass filter and the core conductor may preferably be reduced or the spacing between the resonance circuits may be increased.

When the thickness of the ceramics between the ground electrodes formed on the upper and lower faces of the multilayer band pass filter and the core conductor is reduced, a further problem is raised in that the loss increases. When the spacing between the resonance circuits is increased, the transverse width of the multilayer band pass filter increases. This raises a further problem in that the whole dimensions of the multilayer band pass filter is increased. In other words, only the band of the band pass filter cannot be changed.

The present invention has a further object to provide a method of controlling the band of the multilayer band pass filter without increase of the loss and also without increase of the whole configuration of the multilayer band pass filter.

DISCLOSURE OF THE INVENTION

The present invention provides a multilayer band pass filter which comprises a plurality of series capacitors located between first and second extension electrodes. These capacitors are connected in series to one another and a zero point forming capacitor which is formed by an intermediate capacitor, connected between the connections between the series capacitors and the open end of the core conductor.

BRIEF DESCRIPTION OF THE DRAWINGS

FIGS. 3A–3E are plan views showing various layers S0–S4 into which the multilayer band pass filter is divided;

FIGS. 12A–12F are plan views showing various layers S10–S15 into which the band pass filter of FIG. 10 is divided;

FIG. 13A is a view showing an equivalent circuit usable in the embodiments of FIGS. 10–12;

FIG. 13B is an illustration of the frequency characteristics corresponding to the circuit of FIG. 13A;

FIG. 14 is a plan view showing a state after the capacities of the capacitors have been regulated in the embodiments shown in FIGS. 10–12;

FIGS. 19A–19E are views similar to FIG. 13A–13F, showing another filter F8;

FIG. 23 is a view showing an equivalent circuit usable in the prior art;

FIG. 25 is a table showing results in experiments which were carried out with respect to the embodiment of FIGS. 24A and 24B;

DETAILED DESCRIPTION OF THE PREFERRED EMBODIMENTS

Figure 1:
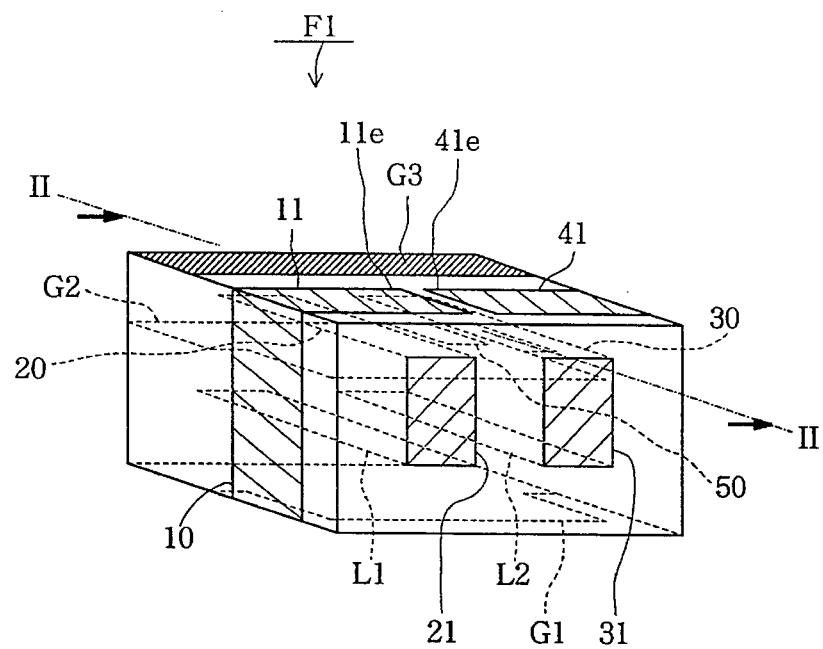
FIG. 1 is a perspective view of one embodiment of a multilayer band pass filter constructed in accordance with the present invention.
Figure 2A:
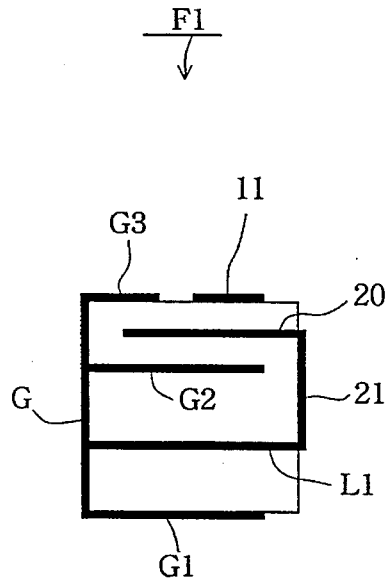
FIGS. 2A and 2B are longitudinal left-hand cross-sections of the band pass filter as viewed along a line II—II from a direction of arrow in FIG. 1.
Figure 2B:
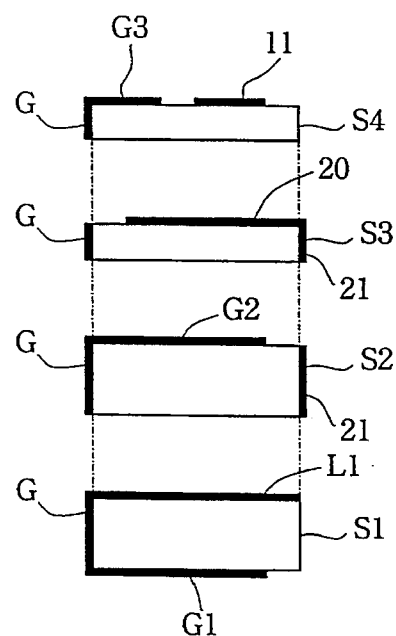

FIG. 1 is a perspective view of the embodiment of a multilayer band pass filter F1 constructed in accordance with the present invention. FIGS. 2A and 2B are longitudinal left-hand cross-sections of the band pass filter as viewed along a line II—II from a direction of arrow in FIG. 1. FIGS. 3A–3E are plan views showing various layers S0–S4 into which the multilayer band pass filter is divided. In these figures, similar parts are designated by similar reference numerals. This is also true of FIGS. 4A–4B and subsequent figures.

This embodiment comprises four layers S1, S2, S3 and S4. In the manufacturing process, an electrically conductive paste for forming first and second core conductors L1 and L2 is printed over the green sheet of the first layer S1 (ceramics before baked). The green sheet of the second layer S2 is then deposited over the first printed green sheet. An electrically conductive paste for forming a ground electrode G2 is printed on the second green sheet. An electrically conductive paste for forming a first capacitor electrode 20, second capacitor electrode 30 and capacity increasing electrode 50 is deposited over the third printed green sheet. The green sheet of the fourth layer S4 is further deposited over the third printed green sheet. The assembly is baked.

After the baking step, an electrically conductive paste for forming a first extension electrode 11, a second extension electrode 41 and a ground electrode G3 is printed over the top of the fourth layer S4. In this case, the right end part 11e of the first extension electrode 11 is positioned new, but opposed to, the left end part 41e of the second extension electrode 41 in the top of the multilayer band pass filter F1. A zero point forming capacitor will be formed where the opposing parts 11e and 41e are opposed to the capacity increasing electrode 50. In other words, the capacity increasing electrode 50 is located at a location that is opposed to the end electrode parts 11e and 41e through ceramics.

The first extension electrode 11 and ground electrode G3 are positioned opposing the capacitor electrode 20 through ceramics, while the second extension electrode 41 and ground electrode G3 are positioned opposing the capacitor electrode 30 through ceramics. The first and second core conductors L1 and L2 form inductors.

It is assumed in FIG. 1 that the faces of the multilayer band pass filter F1 including connecting conductors 21, 31 and extension electrodes 11, 41 are respectively the front and top faces of the band pass filter. However, the left, right, back and bottom faces of the multilayer band pass filter F1 are respectively printed by the electrically conductive paste for forming a first input/output electrode 40 connected to the extension electrode 41 and capacitor electrodes G and G1. The front face of the multilayer band pass filter F1 is printed with an electrically conductive paste for forming a connecting conductor 21 which connects the core conductor Li and the capacitor electrode 20, and with an electrically conductive paste for forming a connecting conductor 31 which connects the core conductor L2 and the capacitor electrode 30.

Figure 4A:
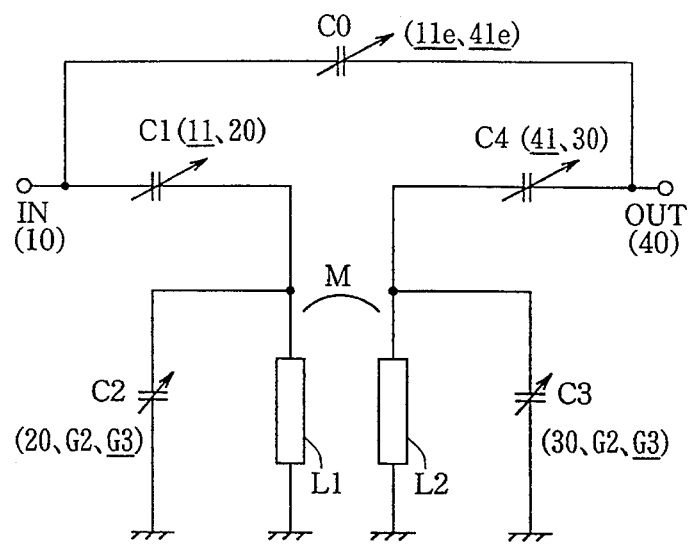
FIG. 4A is a view showing the equivalent circuit of the band pass filter.

FIG. 4A shows an equivalent circuit used in the abovementioned embodiment and the characteristics of the band pass filter according to the above embodiment.

In this embodiment, the opposed parts 11e and 41e of the first and second extension electrodes 11 and 14 are respectively positioned opposing the capacity increasing electrode 50 to form a zero point forming capacitor C0.

A first input/output capacitor C1 is formed by the extension electrode 11, first capacitor electrode 20 and ceramics, while a second input/output capacitor C4 is formed by the second extension electrode 41, second capacitor electrode 30 and ceramics.

The first capacitor electrode 20 is further connected to the first core conductor L1 to form a first resonance capacitor C2 between the first capacitor electrode 20 and the ground electrodes G2, G3. Similarly, the second capacitor electrode 30 is connected to the second core conductor L2 to form a second resonance capacitor C3 between the second capacitor electrode 30 and the ground electrode G2, G3.

The operation of the aforementioned embodiment will be described below.

Figure 5:
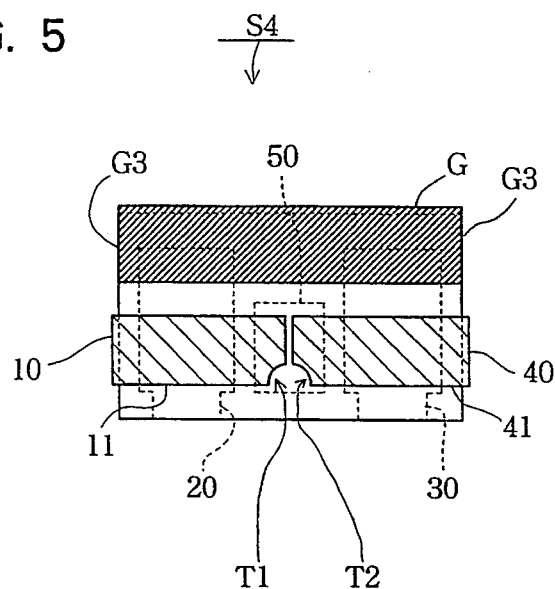
FIG. 5 is a top view of the multilayer band pass filter when the capacity of the zero point forming capacitor C0 is regulated.

FIG. 5 is a top view of the multilayer band pass filter when the capacity of the zero point forming capacitor C0 is regulated.

After the multilayer band pass filter F1 has been baked, the opposed parts 11e and 41e of the first and second extension electrodes 11 and 41 will be exposed, as shown in FIG. 5. The opposed parts 11e and 41e can easily be trimmed. More particularly, by trimming the part 11e to form a trimmed part T1 and/or trimming the part 41e to form a trimmed part T2, the parts opposing electrode 50 can be reduced to decrease and regulate the capacity of the zero point forming capacitor C0. The trimming can be accomplished by sand blast, laser beam or the like.

Figure 6:
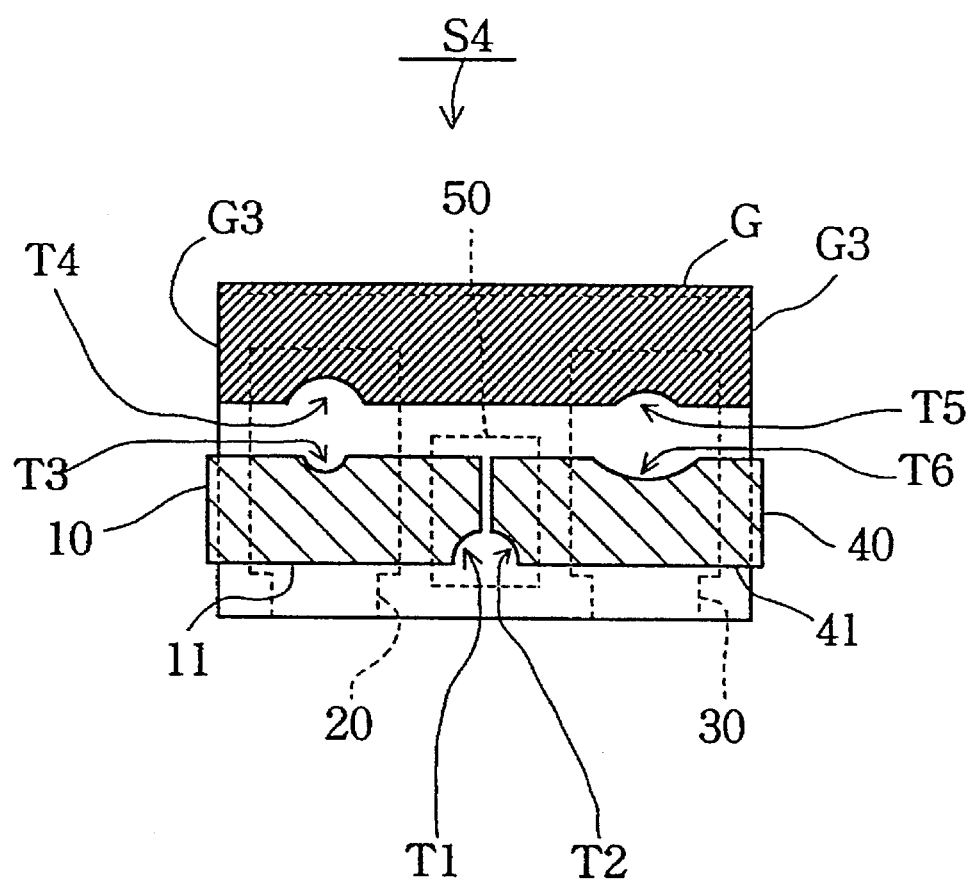
FIG. 6 is a top view of the multilayer band pass filter when the capacities of capacitors other than the zero point forming capacitor C0 are also regulated.
Figure 7F:
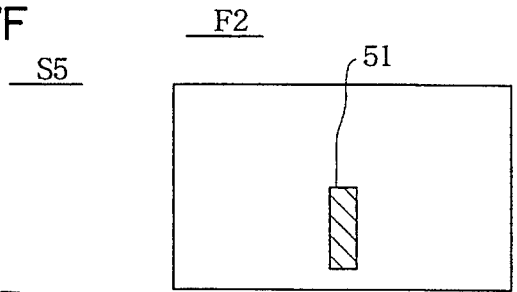
FIG. 7A–7F are views of another embodiment of a multilayer band pass filter constructed in accordance with the present invention.
Figure 7E:
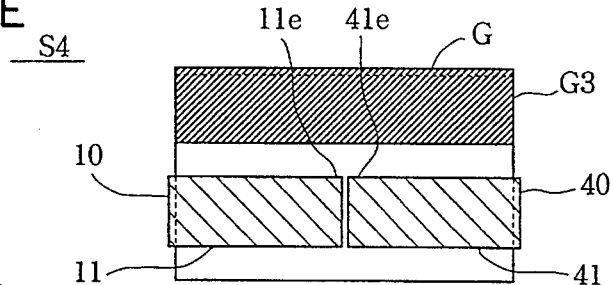
Figure 7D:
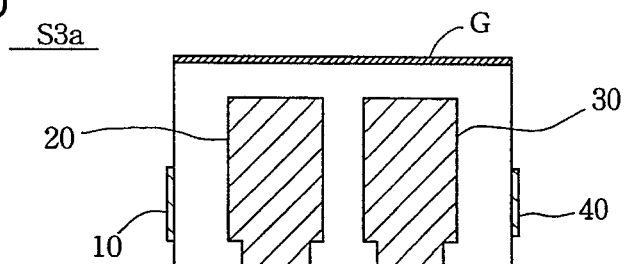
Figure 7C:
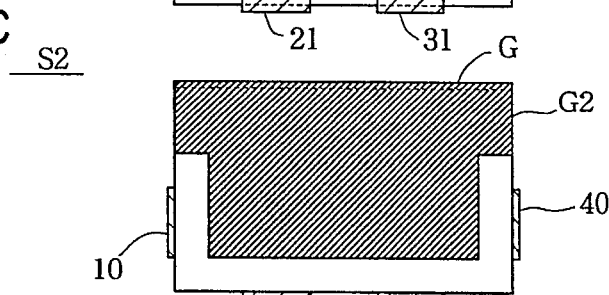
Figure 7B:
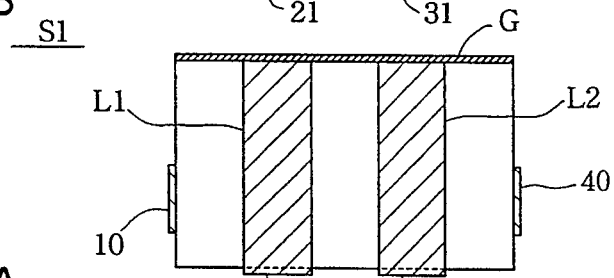
Figure 7A:
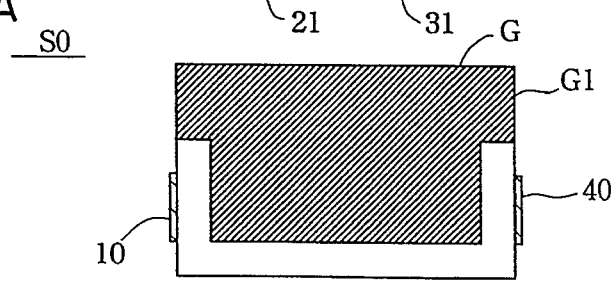

FIG. 6 is a top view of the filter F1 when the capacities of capacitors other than the zero point forming capacitor CO are also regulated.

In the above-mentioned embodiment, when the extension electrode 11 is trimmed to form a trimmed part T3, the capacity of the input/output capacitor C1 can be reduced. When the part of the ground electrode G3 opposed to the capacitor electrode 30 is trimmed to form a trimmed part T4, the capacity of the resonance capacitor C3 can be reduced. When the extension electrode 41 is trimmed to form a trimmed part T6, the capacity of the input/output capacitor C4 can be reduced. In FIG. 4A, each parenthesized reference numeral adjacent to a normal reference numeral denotes an electrode while each underlined reference numeral designates an electrode to be trimmed to regulate its capacity.

Since all the trimmed parts T1, T2, T3, T4, T5 and T6 the capacities of the capacitors C0, C1, C2, C3 and C4 exist on the top face of the multilayer band pass filter F1, the capacities of the five capacitors can easily be regulated simply by controlling the nozzle of the sand blaster in the X- and Y-axis directions without requiring control in the Z-axis direction.

However, the multilayer band pass filter only requires all the electrodes for forming the zero point forming capacitor CO the first input/output capacitor C1, the second input/output capacitor C4, the first resonance capacitor C2 and the second resonance capacitor C3 to be formed on the same surface. If these electrodes are formed on one face other the top face (one side face or bottom face), the regulation of capacity can easily be carried out.

Although the opposed parts 11e and 41e of the first and second extension electrodes 11, 41 are arranged closed and opposed to each other in the top of the multilayer band pass filter F1 of the aforementioned embodiment, the opposed parts 11e and 41e may be closed and opposed to each other in a face other than the top face of the multilayer band pass filter F1. Further, the electrodes for the zero point forming capacitor C0 may be located at a face different from those of the other electrodes C1–C5. Since the zero point forming capacitor C0 is formed by arranging 11e and 41e to oppose the capacity increasing electrode 50 in the above-mentioned embodiment, it is not necessarily required that the parts 11e and 41e are closed and opposed to each other unless they are offset relative to the capacity increasing electrode 50.

Although the above-mentioned embodiment has been described as to the ground electrode G3 on the top of the multilayer band pass filter, that ground electrode G3 may be removed from the top.

FIGS. 7A–7F are views showing another embodiment of a multilayer band pass filter F2 constructed in accordance with the present invention.

FIGS. 7A–7F show layers S0, S1, S2, S3a, S4 and S5 into which the multilayer band pass filter F2 is divided. In the multilayer band pass filter F2, the relationship between the extension electrodes 11, 14 and the capacity increasing electrode S1 is reversed in comparison with the relationship in the multilayer band pass filter F1. More particularly, the mltulayer band pass filter F2 comprises a third layer S3a substituting for the third layer S3 in the multilayer band pass filter F1 and a fifth layer S5, where S3a replaces layer S3 from filter F1 and where layer S5 is a new layer.

The third layer S3a includes capacitor electrodes 20 and 30 on the ceramics, while the fifth layer S5 includes a capacity increasing electrode 51 which is positioned oppose parts 11e and 41e. The multilayer band pass filter F2 can regulate the capacity of the zero point forming capacitor C0 by decreasing the area of the capacity increasing electrode 51. Since the capacity increasing electrode 51 is exposed to the multilayer band pass filter F2, the capacity of the zero point forming capacitor C0 can be regulated after the multilayer band pass filter F2 has been baked.

The embodiment of FIGS. 7A–7F has been described with a first-stage resonance circuit being defined by the inductor formed by the core conductor L1 and the resonance capacitor C2, while a second resonance circuit is defined by the inductor formed by the core conductor L2 and the resonance capacitor C3, thereby providing a double-stage resonance circuit defining the band pass filter. However, a single-stage resonance circuit may alternatively be used to form the band pass filter as shown in FIG. 8.

Figure 8:
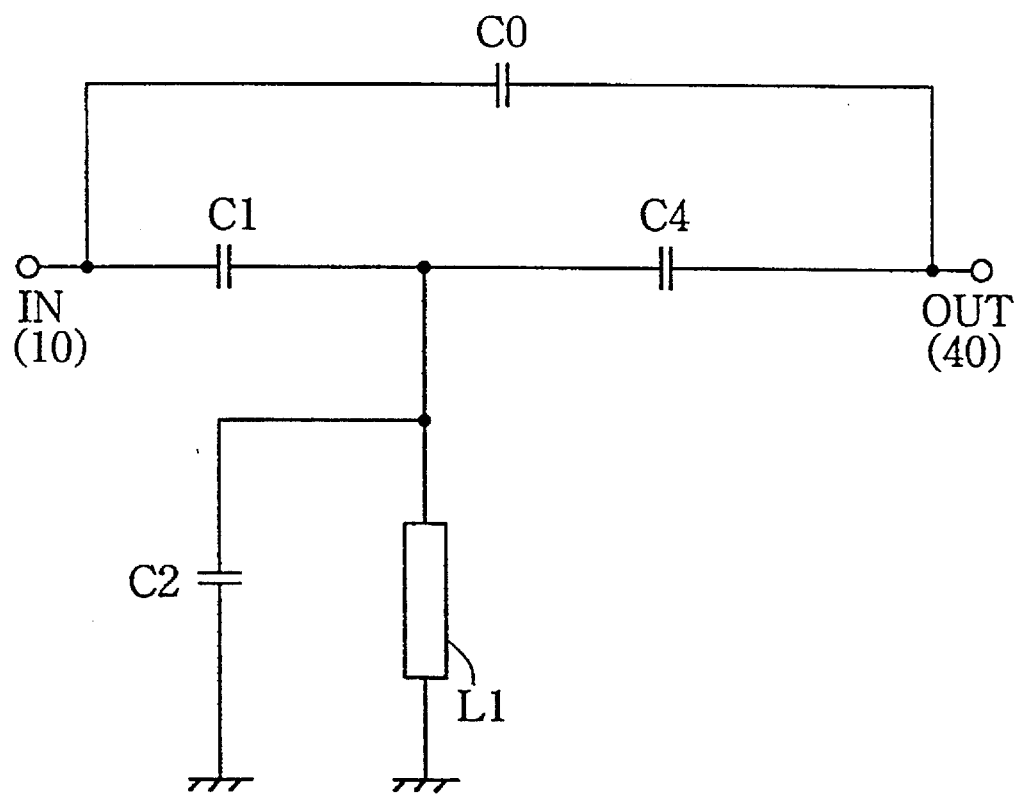
FIG. 8 is a view showing an equivalent circuit usable in still another embodiment of the present invention.
Figure 9E:
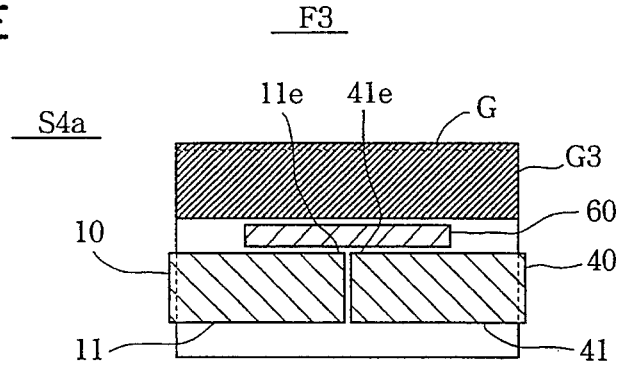
FIGS. 9A–9E are views of the capacitive coupling between first- and second-stage resonance circuits in the embodiment of FIG. 8.
Figure 9D:
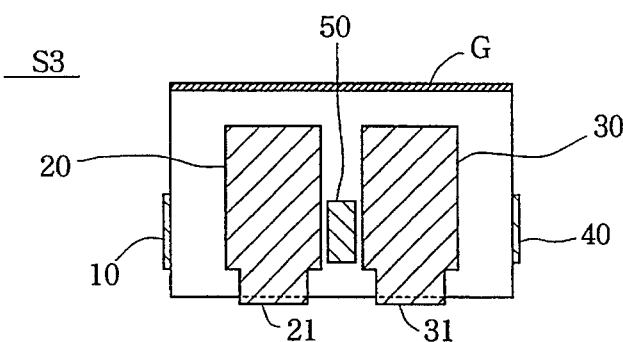
Figure 9C:
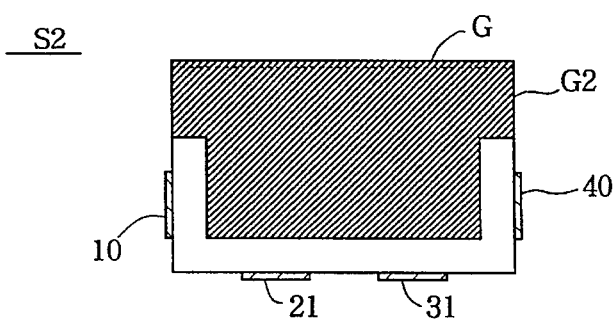
Figure 9B:
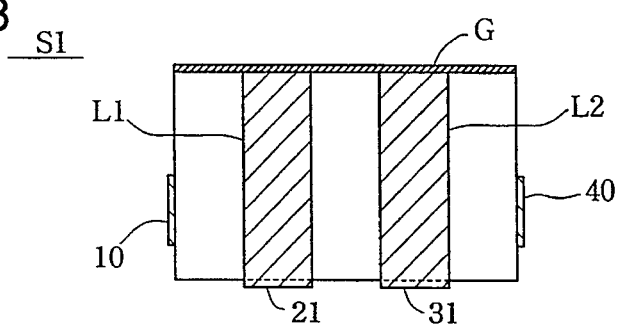
Figure 9A:
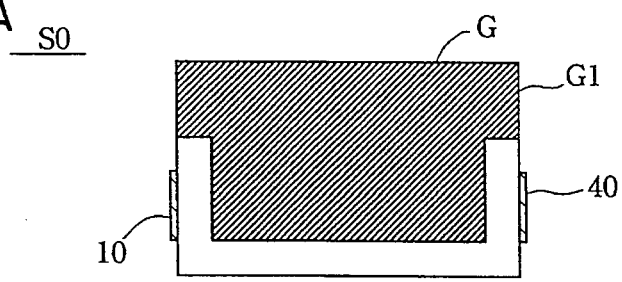

The embodiment of FIG. 8 is a band pass filter which is defined by a single-stage resonance circuit. This is accomplished by removing the core conductor L2 and resonance capacitor C3 from the circuit shown in FIG. 4A, and also by connecting the left end of the input/output capacitor C4 as viewed in FIG. 4A to the right end of the input/output capacitor C1 as viewed in FIG. 4A. The embodiment of FIG. 8 may be applied to a band pass filter which is defined by three or more stages of resonance circuits.

The embodiment of FIG. 8 illustrates inductively coupling a first-stage resonance circuit which includes the inductor formed by the core conductor L1 and the resonance capacitor C2, and a second-stage resonance circuit which includes the inductor formed by the core conductor L2 and the resonance capacitor C3. However, the resonance circuits may capacitively be coupled with each other as shown in FIGS. 9A–9E, or they may inductively and capacitively be coupled with each other.

The embodiment of FIG. 8 has a capacity increasing electrode opposed to first and second extension electrodes through dielectric, where these electrodes define a zero point forming capacitor. At least one of these electrodes is located on the surface of the multilayer band pass filter so that the capacity of the zero point forming capacitor can be regulated after the multilayer band pass filter has been baked.

A multilayer band pass filter F3, according to an embodiment shown in FIGS. 9A–9E, is provided by capacitively coupling the first-and second-stage resonance circuits in the filter F1 shown in FIGS. 3A–3E. In the filter F3, the fourth layer S4, shown in FIG. 3A, is replaced by a fourth layer S4a on which an electrically conductive paste for forming a connecting electrode 60 is printed in non-contact with the other electrodes (extension electrodes 11, 41 and ground electrode G3). In this case, the connecting electrode 60 is printed such that it overlaps the capacitor electrodes 20 and 30 through ceramics. Thus, the first- and second-stage resonance circuits are capacitively coupled with each other through the connecting electrode 60 and ceramics. In this case, the third—zero layers shown in FIGS. 9B–9E are the same as those of FIGS. 3B–3E. In such a manner, the capacities of the capacitors C0, C1, C2, C3 and C4, and the capacity of the capacitive coupling between the first- and second-stage resonance circuits can be regulated.

Figure 4B:
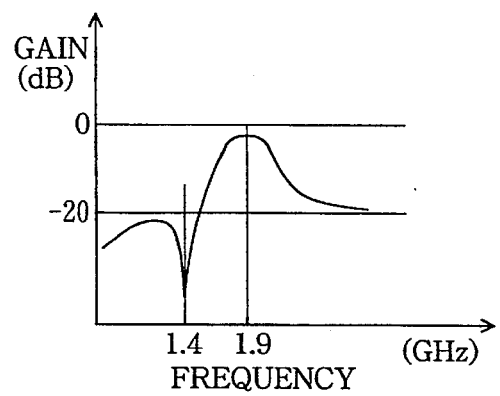
FIG. 4B is an illustration of the frequency characteristics corresponding to the circuit of FIG. 4A.
Figure 30A:
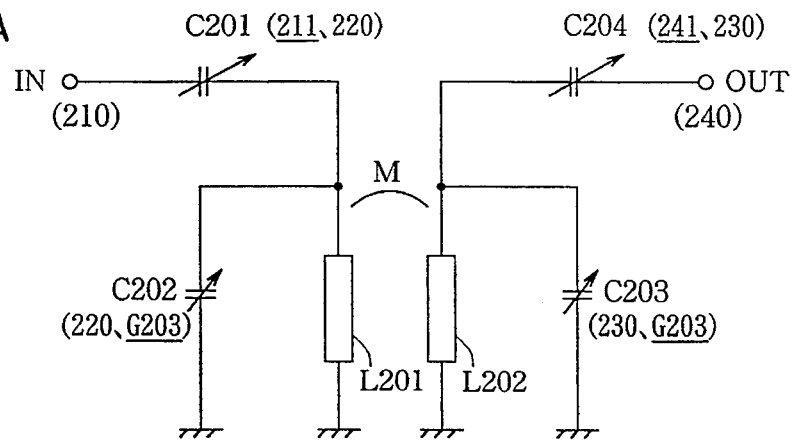
FIG. 30A is a view showing an equivalent circuit usable in the multilayer band pass filter F.
Figure 30B:
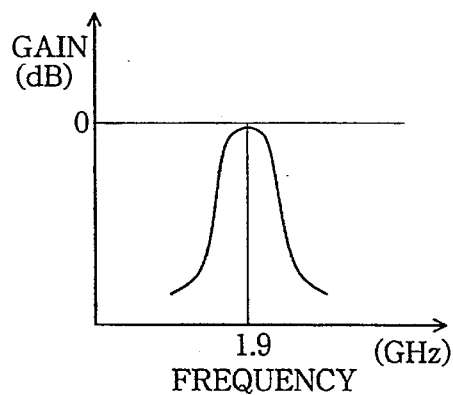
FIG. 30B is an illustration of the frequency characteristics corresponding to the circuit of FIG. 30A.

The frequency characteristics of the band pass filter obtained by the embodiment of FIGS. 9A–9E are shown in FIG. 4B, wherein a zero point is formed at 1.4 GHz. For reference, the characteristics of the band pass filter before a zero point is formed are shown in FIG. 30B.

Although the embodiment of FIGS. 9A–9E has been described as to the band pass filter, it may similarly be applied to other filters such as a band elimination filter, a high-pass filter, a low-pass filter and other filters.

Figure 10:
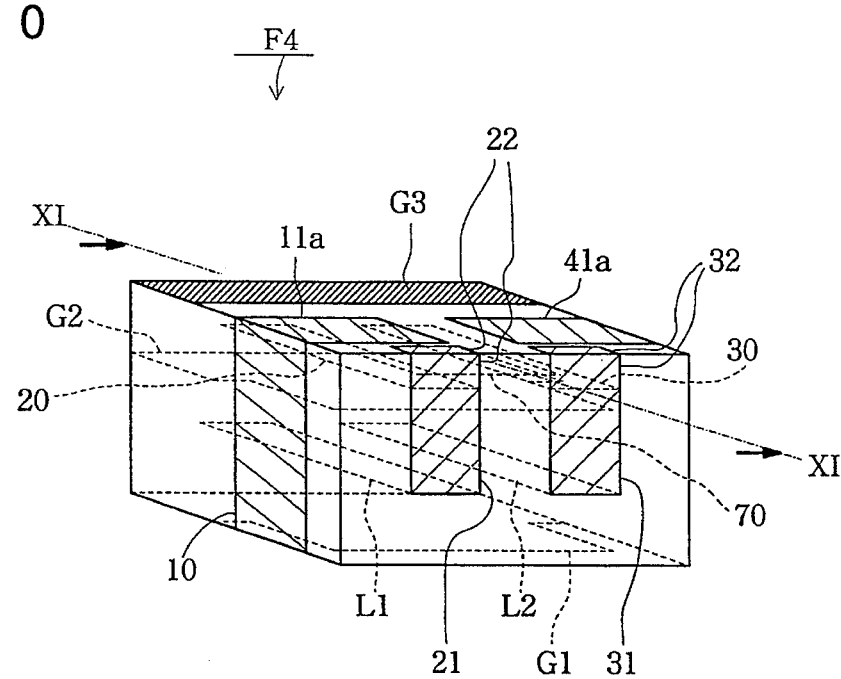
FIG. 10 is a perspective view of a further embodiment of a multilayer band pass filter F4 constructed in accordance with the present invention in which zero points can be formed below and above a given zone.

FIG. 10 is a perspective view showing a further embodiment of a multilayer band pass filter F4 in which zero points can be formed below and above a given range.

Figure 11A:
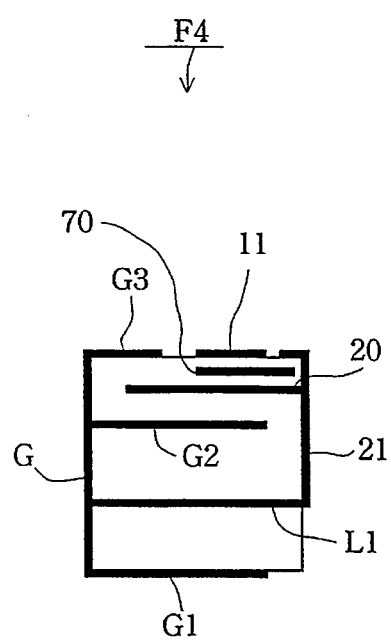
FIGS. 11A and 11B are longitudinal left-hand cross-sections of the multilayer band pass filter as viewed along a line XI—XI from a direction of arrow in FIG. 10.
Figure 11B:
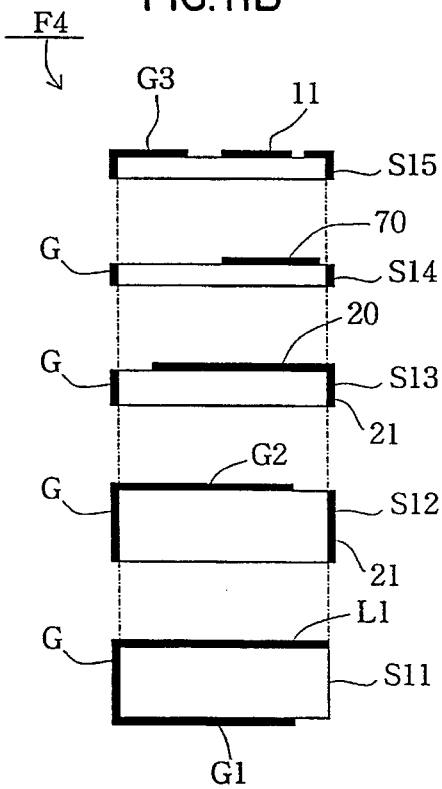
Figure 15F:
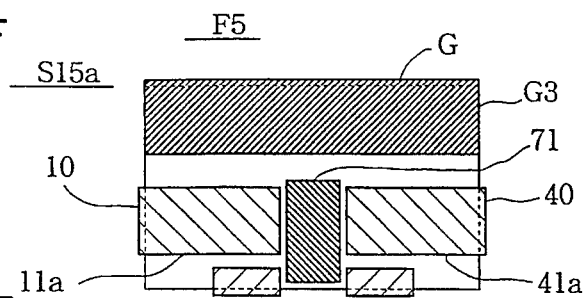
FIGS. 15A–15F show a modified form of the embodiments shown in FIGS. 10–12.
Figure 15E:
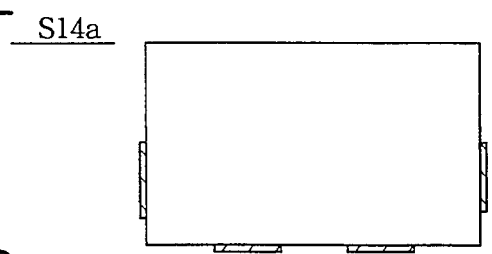
Figure 15D:
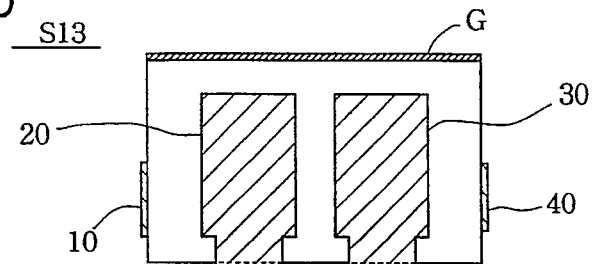
Figure 15C:
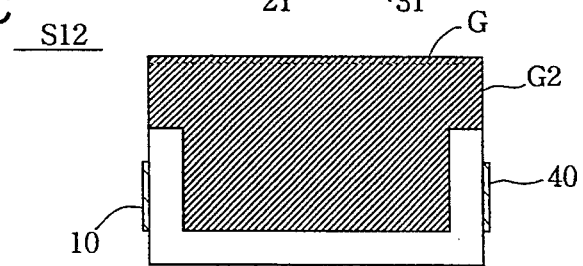
Figure 15B:
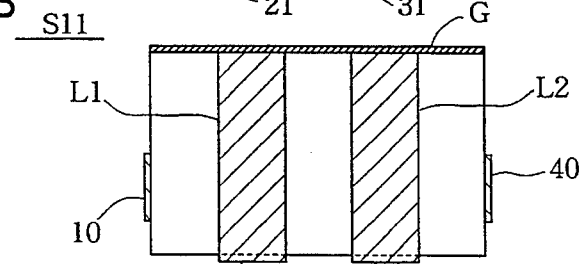
Figure 15A:
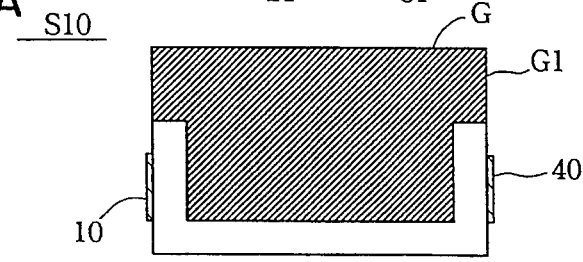

FIGS. 11A and 11B are longitudinal left-hand cross-sections of the multilayer band pass filter as viewed along a line XI—XI from a direction of arrow in FIG. 10. FIGS. 12A–12F are plan views showing various layers S11–S15 into which the band pass filter of FIG. 10 is divided. FIG. 13A is a view showing an equivalent circuit usable in the embodiment of FIG. 10.

The embodiment of FIG. 10 includes five layers S11, S12, S13, S14 and S15. On the manufacturing process, an electrically conductive paste for forming first and second core conductors L1 and L2 is printed over the green sheet of the first layer S11 (ceramics before baked). The green sheet of the second layer S12 is deposited over the first printed green sheet. An electrically conductive paste for forming a ground electrode G2 is printed over the second green sheet over which the green sheet of the third layer S13 is deposited. An electrically conductive paste for forming first and second capacitor electrodes 20, 30 is printed over the third green sheet. The green sheet of the fourth layer S14 is deposited over the third printed green sheet. The green sheet of the fifth layer S15 is deposited over the fourth printed green sheet to form an assembly. This assembly is baked. After the baking step, an electrically conductive paste for forming first and second extension electrodes 11a, 41a, and a ground electrode G3 is printed over the top of the fifth layer S15 while an electrically conductive paste for forming a ground electrode G1 is printed over the bottom (S10) of the first layer S11.

In this case, the zero point forming electrode 70 is one for forming a plurality of series capacitors between the first and second extension electrodes 11a and 41a through dielectric. Further, the zero point forming electrode 70 is arranged opposed to the first and second extension electrodes 11a, 41a and capacitor electrodes 20, 30, respectively. Thus, they define zero point forming capacitors.

In the front face of the multilayer band pass filter F4, a connecting conductor 21 extends to a part of the top face to form an extension electrode 22 over which an electrically conductive paste is printed. Similarly, a connecting conductor 31 extends to a part of the top face of the multilayer band pass filter F4 to form an extension electrode 32 over which an electrically conductive paste is printed.

The parts of the first and second extension electrodes 11a, 41a are arranged opposed to the zero point forming electrode 70 which is further arranged opposed to the parts of the extension electrodes 22 and 32.

The operation of the embodiment of FIG. 10 will now be described.

FIG. 13A shows an equivalent circuit usable in the embodiment shown in FIGS. 10–12 while FIG. 13B shows its frequency characteristics.

In the circuit diagram, the first input/output capacitor C1 is formed by the first extension electrode 11a, first capacitor electrode 20 and ceramics while the second input/output capacitor C4 is formed by the second extension electrode 41a, second capacitor electrode 30 and ceramics. The first resonance capacitor C2 is defined by the first capacitor electrode 20, ground electrodes G2, G3 and ceramics, while the second resonance capacitor C3 is defined by the second capacitor electrode 30, ground electrodes G2, G3 and ceramics. A series capacitor C5 is formed by the first extension electrode 11a, zero point forming electrode 70 and ceramics. A series capacitor C6 is formed by the second extension electrode 41a, zero point forming electrode and ceramics. An intermediate coupling capacitor C7 is formed by the capacitor electrode 20, extension electrode 22, zero point forming electrode 70 and ceramics. An intermediate coupling capacitor C8 is formed by the capacitor electrode 30, extension electrode 32, zero point forming electrode 70 and ceramics. Either of the intermediate coupling capacitor C7 or C8 may be removed.

The series capacitors C5, C6 and intermediate coupling capacitors C7, C8 define a zero point forming capacitor which is used to form zero points below and above a given frequency band, at which a disturbing signal from any adjacent channel or unnecessary radiation can be inhibited.

The frequency characteristics of the band pass filter obtained by the equivalent circuit shown in FIG. 13A are shown in FIG. 13B wherein zero points are formed at 1.4 GHz and 2.2 GHz.

FIG. 14 is a plan view showing a state after the capacities of the respective capacitors have been regulated in the embodiment shown in FIGS. 10–12.

In the embodiment of FIGS. 10–12, the first and second extension electrodes 11a, 41a, the electrodes forming the resonance capacitors C2, C3 (in these embodiment, parts of the ground electrode G3 opposed to the capacitor electrodes 20 and 30), and the electrodes 22, 32 extending from the capacitor electrodes 20, 30 are located on one and the same surface.

When the part T3 of the first extension electrode 11a which is opposed to the capacitor electrode 20 is trimmed, the capacity of the first input/output capacitor C1 can be reduced. When the part T4 of the ground electrode G3 which is opposed to the capacitor electrode 20 is trimmed, the capacity of the resonance capacitor C2 can be reduced. When the part T5 of the ground electrode G3 which is opposed to the capacitor electrode 30 is trimmed, the capacity of the resonance capacitor C3 can be reduced. When the part T6 of the second extension electrode 41a which is opposed to the capacitor electrode 30 is trimmed, the capacity of the second input/output capacitor C4 can be reduced.

When the part T7 of the first extension electrode 11a which is opposed to the zero point forming electrode 70 is trimmed, the capacity of the series capacitor C5 can be reduced. When the part T8 of the second extension electrode 41a which is opposed to the zero point forming electrode 70 is trimmed, the capacity of the series capacitor C6 can be reduced. When the part T9 of the extension electrode 22 which is opposed to the zero point forming electrode 70 is trimmed, the capacity of the intermediate coupling capacitor C7 can be reduced. When the part T10 of the extension electrode 32 which is opposed to the zero point forming electrode 70 is trimmed, the capacity of the intermediate coupling capacitor C8 can be reduced.

FIGS. 15A–15F show a modified form of the embodiment shown in FIGS. 10–12.

The filter F5 is different from the filter F4 in that the electrically conductive paste corresponding to the zero point forming electrode 70 is not printed on the fourth layer S14a, and a new zero point forming electrode 71 is printed on the same face as the extension electrodes 11a and 41a, being positioned between the extension electrodes 11a and 41a. The zero point forming electrode 71 is basically of the same function as that of the zero point forming electrode 70 and arranged opposed to the extension electrodes 11a and 41a to form series capacitors C5 and C6. The zero point forming electrode 71 is also arranged opposed to the capacitor electrodes 20 and 30 to form intermediate coupling capacitors C7 and C8.

In place of the zero point forming electrodes 70 and 71, a zero point forming electrode may be formed on the same face as the capacitor electrodes 20 and 30, being positioned between the capacitor electrodes 20 and 30. This is similar to that of FIGS. 3A–3E. If it is considered that the capacity increasing electrode 50 of FIGS. 3A–3E is a zero point forming electrode, two zero points can be formed, as in the embodiment of FIGS. 10–12. More particularly, the capacity increasing electrode 50 as a zero point forming electrode can form the series capacitors C5 and C6 by being positioned opposing the extension electrodes 11a and 41a, while forming intermediate coupling capacitors C7 and C8 by being positioned opposing the capacitor electrodes 20 and 30.

Figure 16:
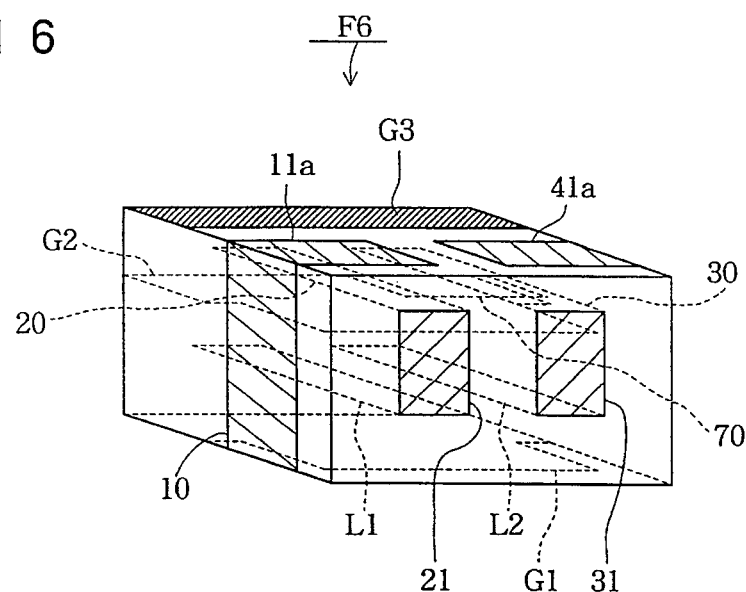
FIG. 16 is a view showing another modified filter F6 of the embodiments shown in FIGS. 10–12.

FIG. 16 shows a further modified form F6 of the embodiment shown in FIGS. 10–12.

The filter F6 is provided by removing the extension electrodes 22 and 32 from the filter F4 shown in FIG. 10, but can form two zero points.

Although two series capacitors are disposed between the first and second input/output terminals 10 and 40 in the filter F6, three or more series capacitors may be disposed.

The resonance circuit formed by the inductor and resonance capacitor, the first input/output capacitor disposed between the first input/output terminal and the inductor, the second input/output capacitor disposed between the second input/output terminal and the inductor, the series capacitors connected in series to one another between the first and second input/output terminals and the intermediate coupling capacitors disposed between the connections of the series capacitors and the inductor may be formed as individual parts.

Figure 17A:
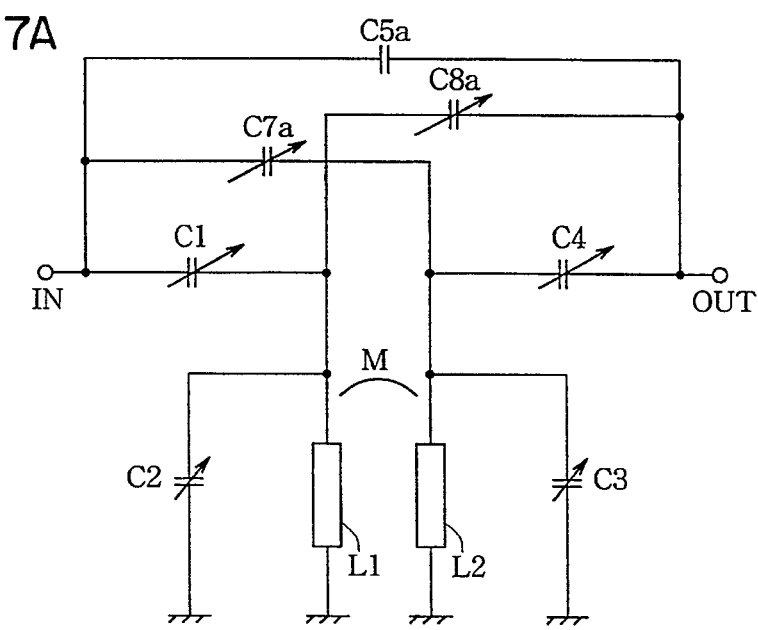
FIG. 17A is a view showing a modified form of the equivalent circuit shown in FIG. 13A.
Figure 17B:
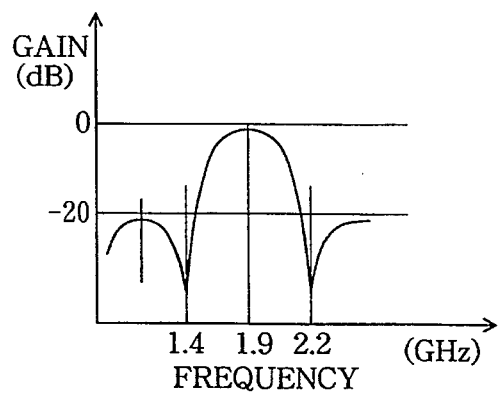
FIG. 17B is an illustration of the frequency characteristics corresponding to the circuit of FIG. 17A.
Figure 18E:
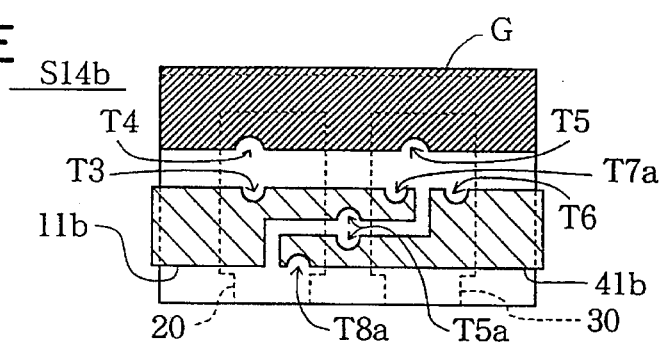
FIGS. 18A–18E are views similar to FIG. 13A–13F, showing a filter F7.
Figure 18D:
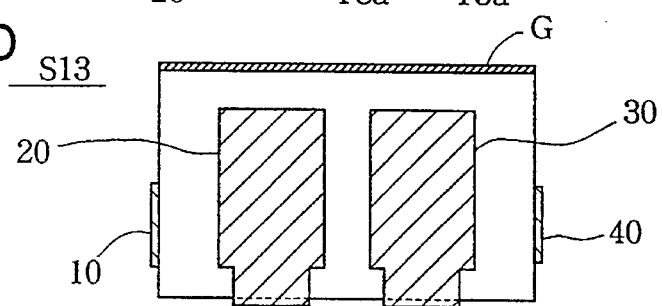
Figure 18C:
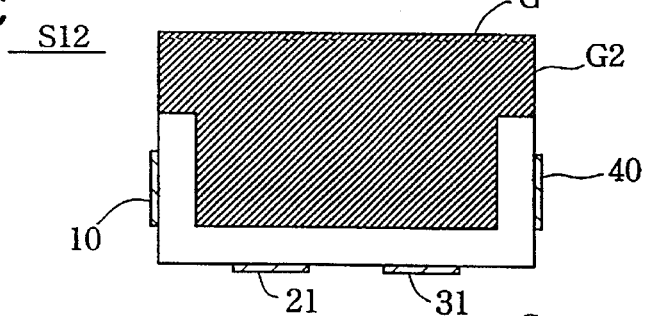
Figure 18B:
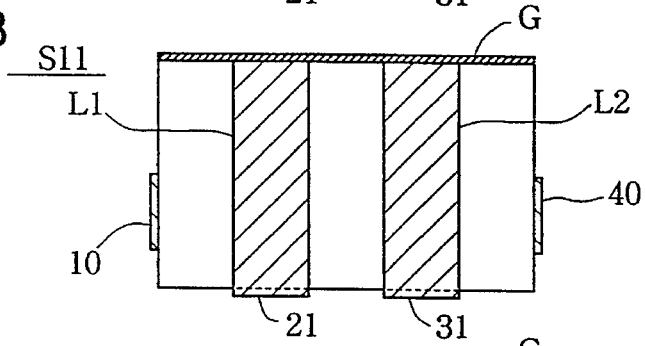
Figure 18A:
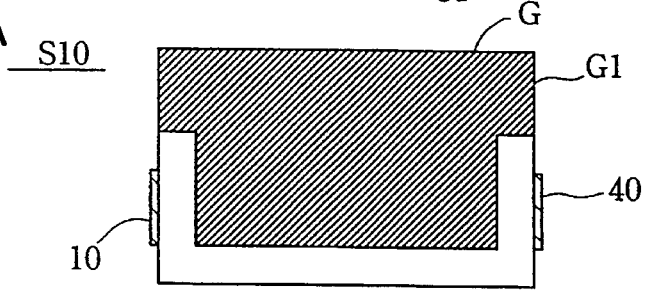

FIG. 17A is a view showing a modified form of the equivalent circuit shown in FIG. 13A while FIG. 17B is a graph showing the frequency characteristics thereof.

In this equivalent circuit, the series capacitors C5 and C6 of FIG. 17A are replaced by a capacitor C5a while the intermediate coupling capacitors C7 and C8 are replaced by capacitors C7a and C8a. The capacitor C7a is located between an input terminal IN and the second core conductor L2 while the capacitor C8a is located between an output terminal OUT and the first core conductor L1.

FIGS. 18A–18E are views similar to FIGS. 13A–13F, showing a multilayer band pass filter F7.

For convenience, FIGS. 18A–18E show the band pass filter in which the electrodes have been formed in the ceramics and thereafter trimmed, the trimmed parts T3–T6 being similar to those of FIG. 14.

The filter F7 has zero—third layers similar to those of the filter F7 shown in FIGS. 15A–15F, and a fourth layer S14a on which extension electrodes 11b and 41b are formed, as shown in FIGS. 18A–18E. The extension electrode 11b is arranged opposed to the capacitor electrode 20 through ceramics and further extended to the capacitor electrode 20 through ceramics and further extended to be arranged opposed to the capacitor electrodes 30 through ceramics. The extension electrode 41b is arranged opposed to the capacitor electrode 30 through ceramics and further extended to be arranged opposed to the capacitor electrode 20 through ceramics. The opposed extension electrodes 11b and 41b form a capacitor C5a which can be trimmed to reduce the capacity thereof.

The opposed parts of the extension electrode 11b and capacitor electrode 30 form a capacitor C7a, the capacity of which can be reduced by trimming part T7a. The opposed parts of the extension electrode 41b and capacitor electrode 20 form a capacitor C7a, the capacity of which can be reduced by trimming a trimming part T8a. The capacitors C5a, C7a and C8a define a zero point forming capacitor.

FIGS. 19A–19E are similar to FIG. 13A–13E, showing a further multilayer band pass filters F8 which has the capacitor C8a, but not the capacitor C7a.

The filter F8 has zero—second layers similar to those of FIGS. 15A–15F, and a third layer S13c on which a capacitor electrode 20 having a protrusion 22 is formed. The filter F8 further includes a fourth layer S41c in which an electrode 80 is formed over extension electrodes 11c, 41c and also over the protrusion 22. Insulation layers (not shown) are further formed between each of the extension electrodes 11c, 41c, protrusion 22 and the electrode 80.

For convenience, FIGS. 19A–19E show the band pass filter in which the electrodes have been formed in the ceramics and thereafter trimmed, the trimmed parts T3–T6 being similar to those of FIG. 14.

The extension electrodes 11c and 41c are arranged opposed to the electrode 80 through the insulation layers to form a capacitor C5a, the capacity of which can be reduced by trimming part T5a. A protrusion 22 is formed opposed to the electrode 80 through the insulation layer to form a capacitor C8a, the capacity of which can be reduced by trimming a trimming part T8a. The capacitors C5a and C8a define a zero point forming capacitor.

In FIGS. 19A–19E, the capacitor C7a shown in FIG. 17 may be formed by providing a protrusion corresponding to the protrusion 22 on the capacitor electrode 30, and arranging that protrusion opposed to the electrode 80.

In the embodiments of FIGS. 10–19E, zero point forming capacitors are formed by a plurality of capacitors connected in series to one another and disposed between the first and second extension electrodes, intermediate coupling capacitors connected between the respective connections of the series capacitors and the open ends of the core conductors, and so on, zero points may therefore be formed below and above a given zone.

Figure 20A:
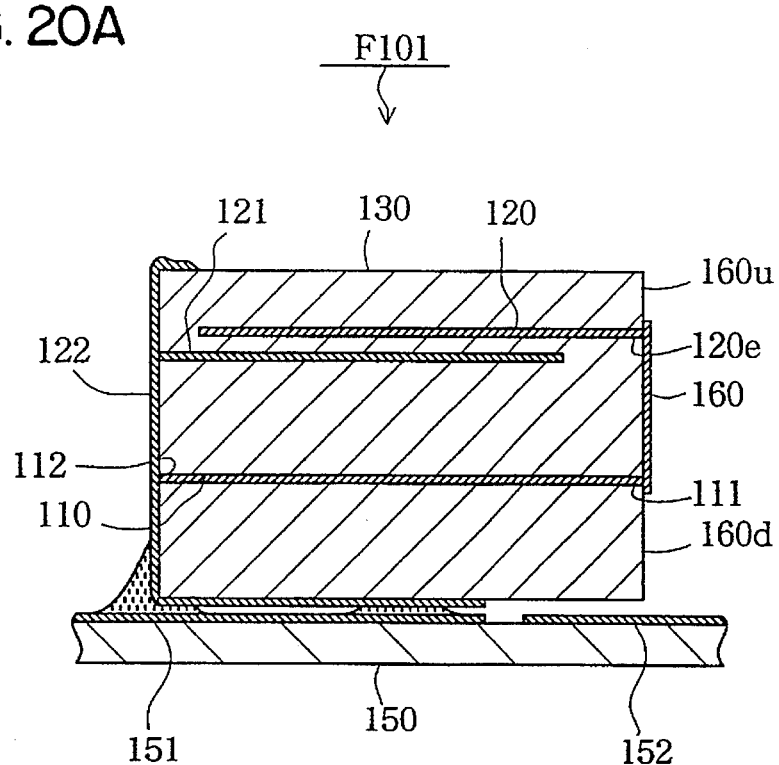
FIGS. 20A and 20B are views showing a first embodiment of the present invention in which the entire characteristics of the band pass filter will not be changed when it is mounted on a mother board.
Figure 20B:
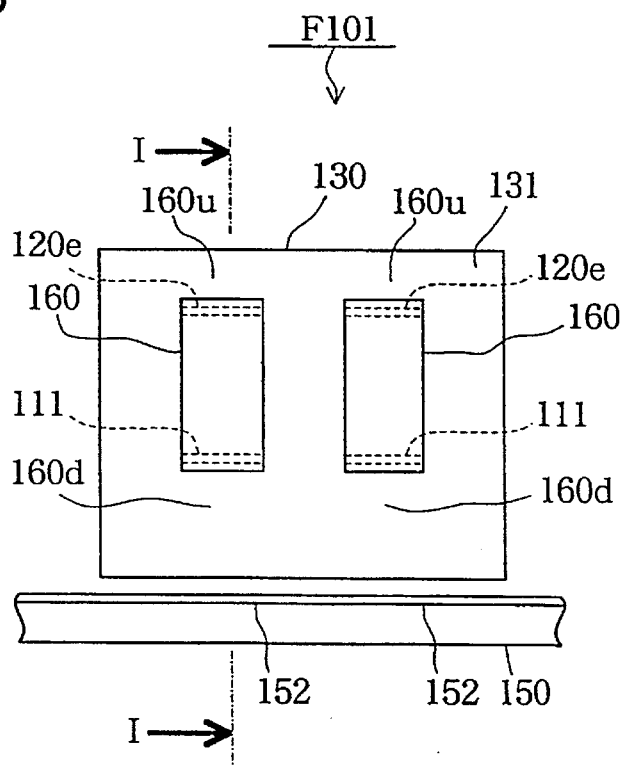
Figure 21A:
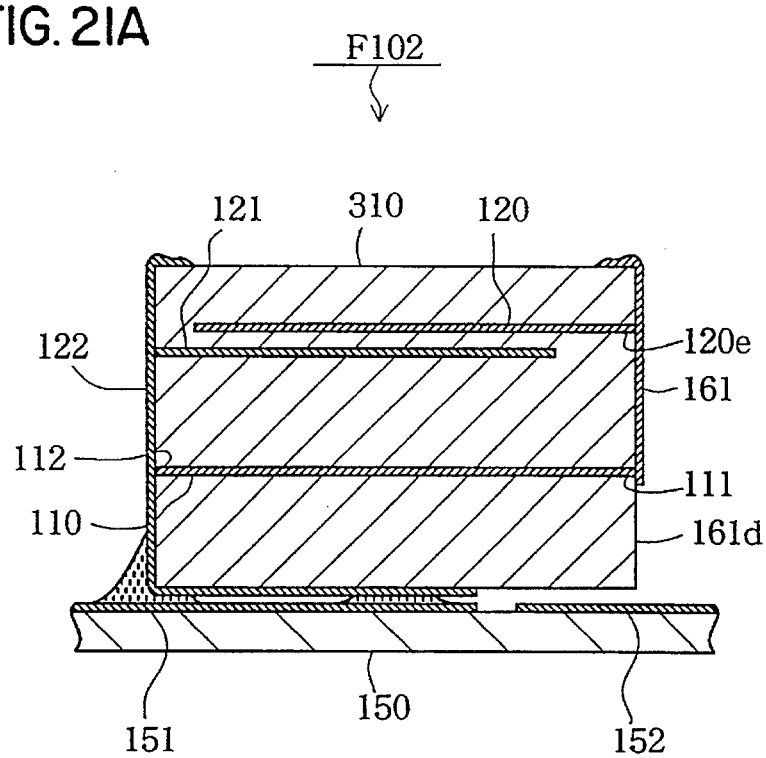
FIGS. 21A and 21B are views showing a second embodiment of the present invention in which the entire characteristics of the band pass filter will not be changed when it is mounted on a mother board.
Figure 21B:
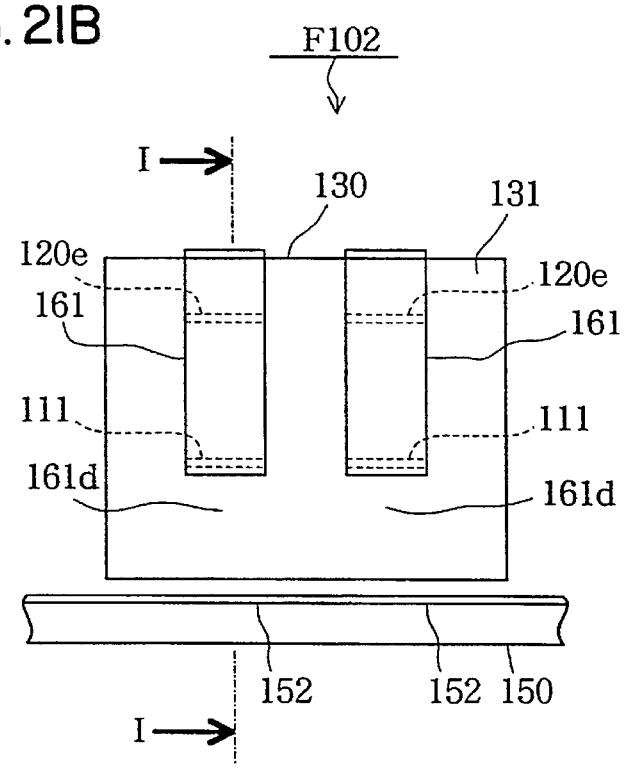
Figure 22A:
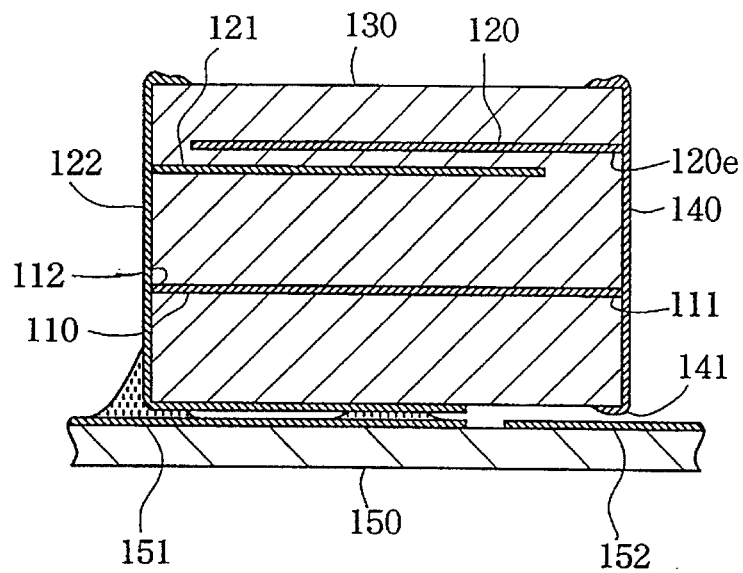
FIGS. 22A and 22B views showing a multilayer band pass filter according to the prior art.
Figure 22B:
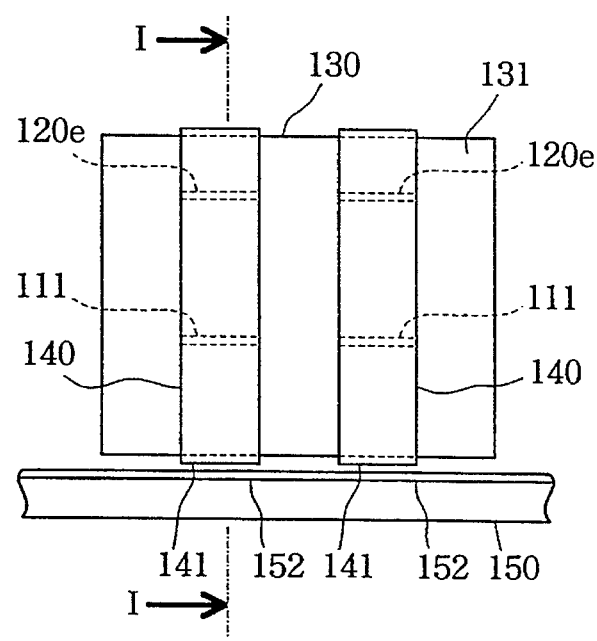
Figure 2:
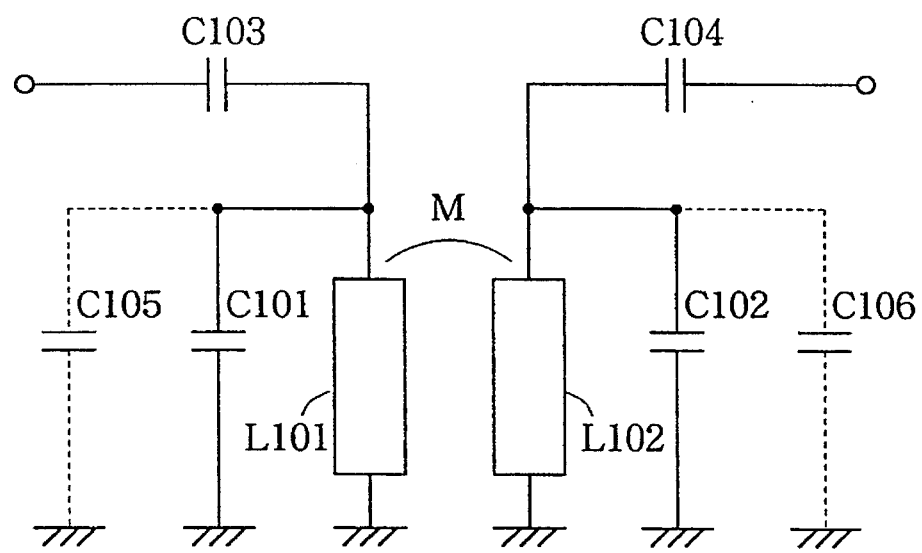

FIGS. 20A and 20B show an embodiment of the present invention in which the characteristics of the entire band pass filter will not change when it is mounted on a mother board. FIG. 20A is a longitudinal cross-section of the band pass filter while FIG. 20B is a right side view thereof. Namely, FIG. 20A is a cross-sectional view taken along a line I—I in FIG. 20B as viewed in a direction of arrow. Further, any soldering part is omitted from FIG. 20B. In the embodiment, parts similar to those of FIGS. 21A and 21B are designated by similar reference numerals. This is also true of the other embodiment.

In the embodiment of FIGS. 20A and 20B, a multilayer band pass filter F101 comprises a resonance circuit defined by an inductor and a resonance capacitor. The inductor is formed by a core conductor 110, while the resonance capacitor is formed by a resonance capacitor electrode 120, a ground electrode 121 and ceramics 130. The open end 111 of the core conductor 110 is connected to the electrode end portion 120e of the resonance capacitor electrode 120 through a connecting surface electrode 160. The connecting surface electrode 160 is formed on the surface (or side face) 131 of the multilayer band pass filter F101.

The connecting surface electrode 160 is located only on the region connecting the open end 111 of the core conductor 110 with the electrode end 120e of the resonance capacitor electrode 120, but not formed in the lower region 160d opposite to the resonance capacitor electrode 120 as viewed from the open end 111 of the core conductor 110. Furthermore, the connecting surface electrode 160 is not formed in the upper region 160u opposite to the open end 111 of the core conductor 110, as viewed from the resonance capacitor electrode 120. In other words, the connecting surface electrode 160 is cut in the lower and upper regions 160d and 16u.

When the multilayer band pass filter F101 is mounted on a mother board 150, the capacity of a capacitor formed between the connecting surface electrode 160 and the ground pattern 152 is sufficiently small to ignore since the lower region 160d is sufficiently wide even if a ground pattern 152 is formed below the connecting surface electrode 160. Therefore, the characteristics of the entire band pass filter will not be influenced by the pattern on the mother board 150. Even if the ground pattern 152 is replaced by a wiring pattern through which signals pass, the operation of the entire system will not be disturbed due to any unnecessary coupling between the connecting surface electrode 160 and the wiring pattern. This eliminates limitations associated with mounting the multilayer band pass filter F101 on the mother board 150.

Even if the multilayer band pass filter F101 is mounted on the mother board 150 in an inverted position, the capacity of a capacitor formed between the connecting surface electrode 160 and the ground pattern 152 is sufficiently small to ignore since the upper region 160u on which the electrode 160 is absent is sufficiently wide. Therefore, the characteristics of the entire band pass filter will not be influenced by the pattern on the mother board 150.

The process of manufacturing the filter F101 is similar to that of the prior art until the baking step. A green sheet, an electrically conductive paste for forming the core conductor 110, a green sheet, an electrically conductive paste for forming the ground electrode 121, a green sheet, an electrically conductive paste for forming the resonance capacitor electrode 120, and a green sheet are each deposited in the described order to form an assembly which is in turn baked. Thereafter, an electrically conductive paste (silver paste) is transferred and printed over the top of each portion of the baked assembly except the lower and upper regions 160d and 160u, thereby forming the connecting surface electrode 160. Alternatively, the connecting surface electrode 160 may be formed by transferring and operating the electrically conductive paste onto the top of the baked assembly including the lower and upper regions 160d and 160u. Thereafter, the paste covering the lower and upper regions 160d and 160u may be removed by sand blaster or the like. FIGS. 2A and 2B show an embodiment of the present invention in which the characteristics of the entire band pass filter will not change when it is mounted on the mother board.

In another embodiment shown by FIGS. 21A and 21B, a connecting surface electrode 161 is cut only at a lower region 161d, where region 161d correspond to the lower region 160d in the first embodiment of FIGS. 20A and 20B. In other words, the connecting surface electrode 161 is not cut at an upper region 161u which corresponds to the upper region 160u in the first embodiment. When the multilayer band pass filter F102 is mounted on the mother board 150, the operation of the entire system will not be disturbed due to any unnecessary coupling produced by the wiring pattern in the mother board 150.

More particularly, the connecting surface electrode of the embodiment shown in FIGS. 20A and 20B is cut in the face of the multilayer band pass filter on which it is formed. It is not at the region opposite to the resonance capacitor electrode as viewed from the open end of the core conductor, and also at the region opposite to the open end of the core conductor as viewed from the resonance capacitor electrode. On the other hand, the embodiment shown in FIGS. 21A and 21B is of such a type that the connecting surface electrode is cut only at the region opposite to the resonance capacitor as viewed from the open end of the core conductor.

In both the embodiments of FIGS. 20A–20B and 21A–21B, the connecting surface electrode extends from the open end of the core conductor or the resonance capacitor electrode toward the end of a face 131 on which the connecting surface electrode is formed. This connecting surface electrode is midway cut.

When the multilayer band pass filter according to each of the embodiments shown in FIGS. 20A–20B and 21A–21B is mounted on the mother board, the capacity of a capacitor formed between the connecting surface electrode and the ground pattern is sufficiently small to ignore even if a ground pattern is formed below the connecting surface electrode. Therefore, the resonance points in the resonance circuit will not be influenced by the wiring pattern on the mother board 150. Further, the operation of the entire system will not be disturbed due to any unnecessary coupling. The limitation provided when the multilayer band pass filter F101 is mounted on the mother board 150 can thus greatly be relieved.

Figure 29A:
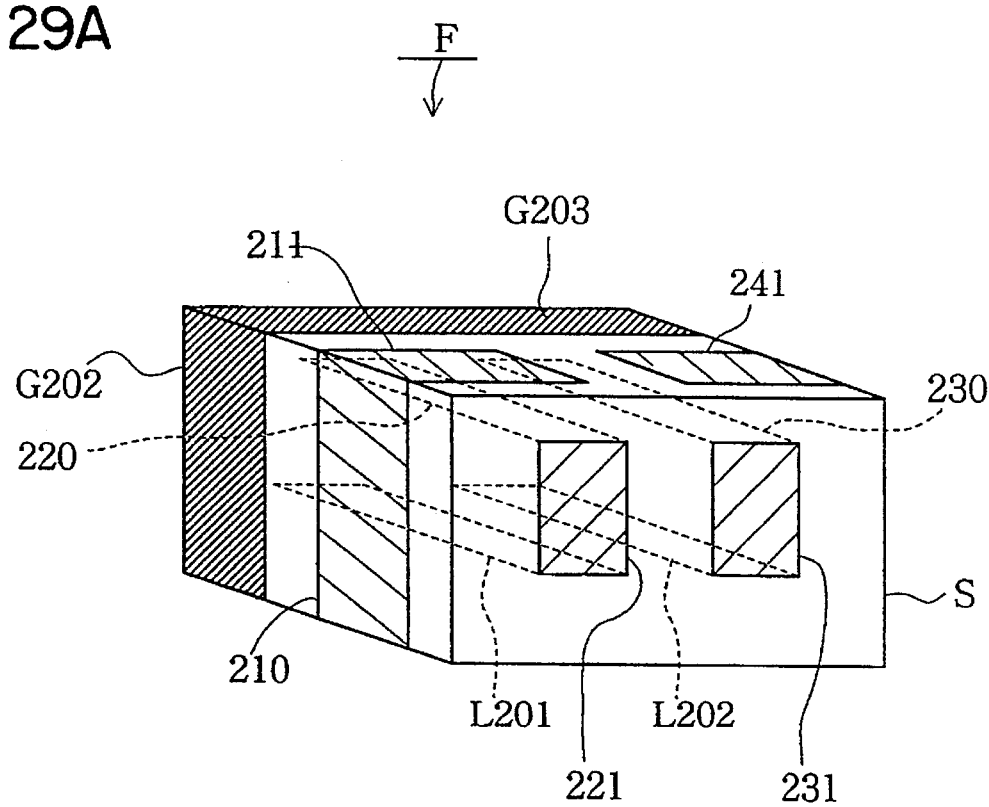
FIGS. 29A and 29B are views illustrating a multilayer band pass filter F.
Figure 29B:
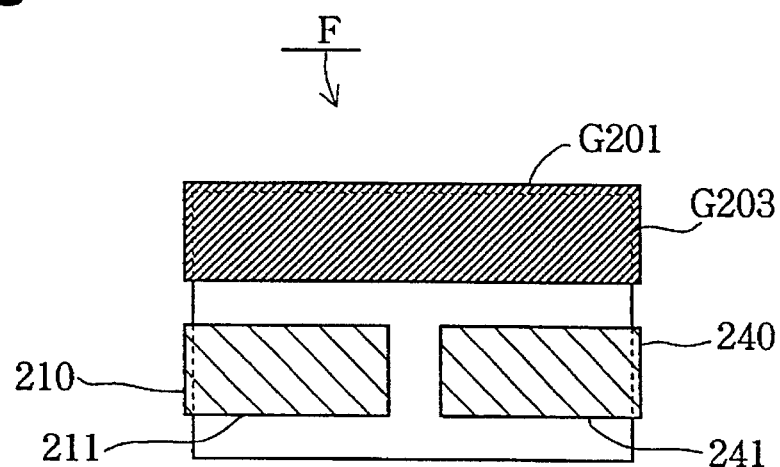

FIGS. 29A and 29B show a multilayer band pass filter F. The capacitor of this filter F can easily be regulated by an automated capacity regulating machine of simplified structure. FIG. 29A is a perspective view of the filter F; FIG. 29B is a plan view; FIG. 30A shows its equivalent circuit; and FIG. 30B shows the characteristics diagram of the band pass filter due to the equivalent circuit.

The multilayer band pass filter F comprises an extension electrode 211 connected to an input terminal 210. The extension electrode 211 is positioned opposite a capacitor electrode 220 through ceramics S to form an input capacitor C201. The capacitor electrode 220 is connected to the open end of a core conductor L201. A resonance capacitor C202 is formed between the capacitor electrode 220 and a ground electrode G203. The electrode 211 forming the input capacitor C201 and the electrode G203 forming the resonance capacitor C202 are disposed in one and the same face.

Similar to the input side, the output side of the filter includes an extension electrode 241 connected to the open end of a core conductor L202. A resonance capacitor C203 is formed between the capacitor electrode 230 and the ground electrode G203. The electrode 241 forming the output capacitor C204 and the electrode G203 forming the resonance capacitor C203 are disposed in one and the same face.

The electrodes 211 and 241 forming the input and output capacitors C201 and C204 are formed on the same face as the electrodes G203 forming the resonance capacitors C202 and C203. Therefore, the capacities of the resonance capacitors C202 and C203 as well as the capabilities of the input and output capacitors C201, C204 can easily be regulated by simply controlling the nozzle of a sand blaster or the like in the directions of X- and Y-axes. However, the automated regulating machine for regulating the capacities of the capacitors can be simplified in structure.

The input electrode 210, output electrode 240 and ground electrode G202 (connected to the ground electrode G203) are basically formed by printing and baking a paste 11 of silver-palladium on the surface of the ceramics S with a thickness of about 10 μm. The input electrode 210, output electrode 240 and ground electrode G202 are connected to electrically conductive patterns of silver, copper or the like on the mother board through soldering.

Figure 31:
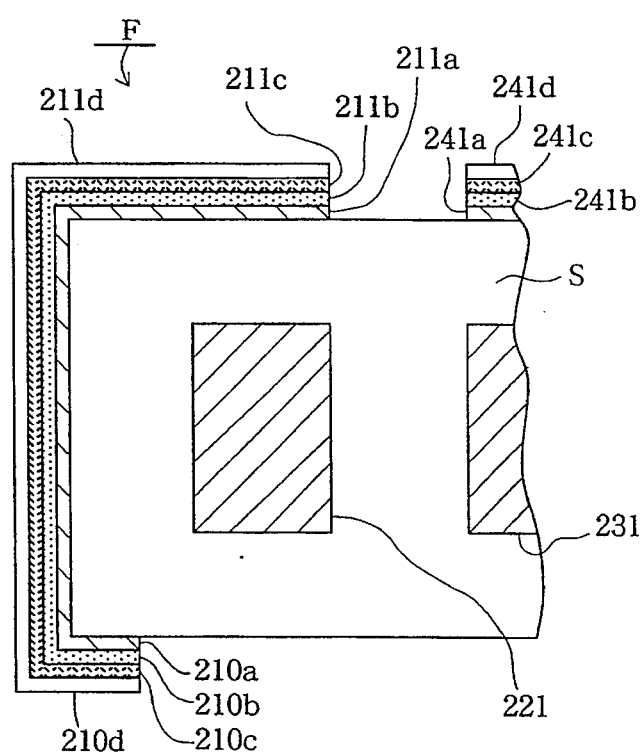
FIG. 31 is a view showing a state under which the multilayer band pass filter F is plated.

FIG. 31 illustrates the plating process corresponding to the background art shown by FIGS. 29A and 29B, where the thickness of each of the various plated films is clearly shown.

If the soldering is to be carried out in the above-mentioned manner, it is required that the heat-resistance in the electrodes is improved with the soldering property. In order to improve the heat-resistance in the electrodes, copper and nickel are electrically plated on a silver-palladium film 211a having a thickness of about 5 μm to form copper and nickel films 211b, 211c. To improve the soldering property, a tin film having a thickness of about 3 μm is electrically plated on the nickel film 211c.

The silver-palladium film 211a, copper film 211b, nickel film 211c and tin film 211d form an extension electrode 211; silver-palladium film 241a, copper film 241b, nickel film 241c and tin film 241d form an extension electrode 241; and silver-palladium film 210a, copper film 210b, nickel film 210c and tin film 210d form an input terminal 210.

When the electrodes of the multilayer band pass filter are to be electrically plated with nickel, an electrolyte is first provided in a plating tank. A plus electrode made of nickel plate, an insulated vessel having an opening, a number of small steel balls received in the vessel, and a minus electrode inserted into the vessel are then immersed in the electrolyte. A multilayer band pass filter to be electrically plated is thrown into the steel balls in the vessel. The plus and minus electrodes are then connected to a battery while agitating the steel balls and the multilayer band pass filter. The minus electrode contacts the steel balls stochastically at all times. Thus, the larger the area of the electrode, the longer the steel balls will contact the electrodes of the filter F. On the other hand, the electrical plating provides a plated film having a thickness which increases proportional to the energizing time. Therefore, the larger the area of the electrode in the filter F, the larger the thickness of the plated film.

The above-mentioned background art raises a problem in that the thickness of the plated film is not uniform when the electrodes have different areas since the thickness of the plated nickel film depends on the area of the electrode. If a necessary plating time is set for the desired thickness of a plated film on a smaller electrode area, the thickness of a plated film on a larger electrode area becomes too thick. This may increase a stress between the thick film (nickel or tin film) and a film adjacent thereto, resulting in separation therebetween.

On the contrary, if the necessary plating time is set for the thickness of a plated film on a larger electrode area, the thickness of a plated film on a smaller electrode area becomes too thin. If the thickness of the nickel film is too thin, the heat-resistance in the soldering will be reduced to separate the silver-palladium film from the ceramics S. Therefore, if the thickness of the tin film is too thin, the soldering property will be reduced.

Such a problem of variability in plating thickness on the different electrode areas is true of the other multilayer band pass filters as well as other types of filters.

Figure 24A:
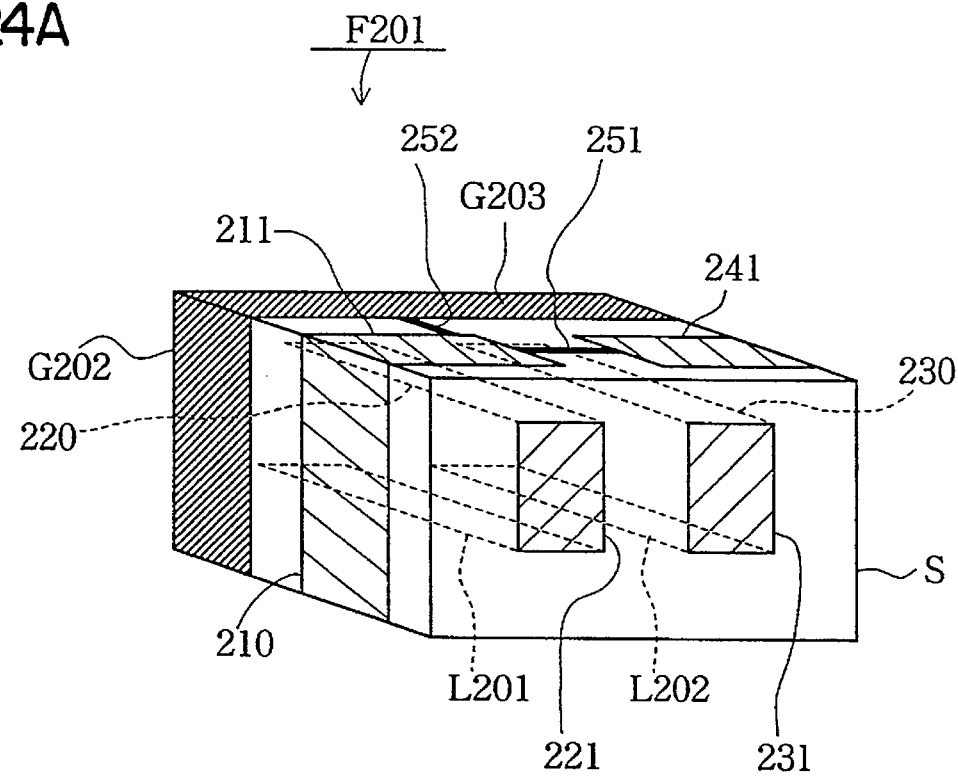
FIGS. 24A and 24B are views showing a multilayer band pass filter F201 which is one embodiment of the present invention which can make its plated film thickness substantially uniform, even if the area of the electrodes to be electrically plated is different from one another.
Figure 24B:
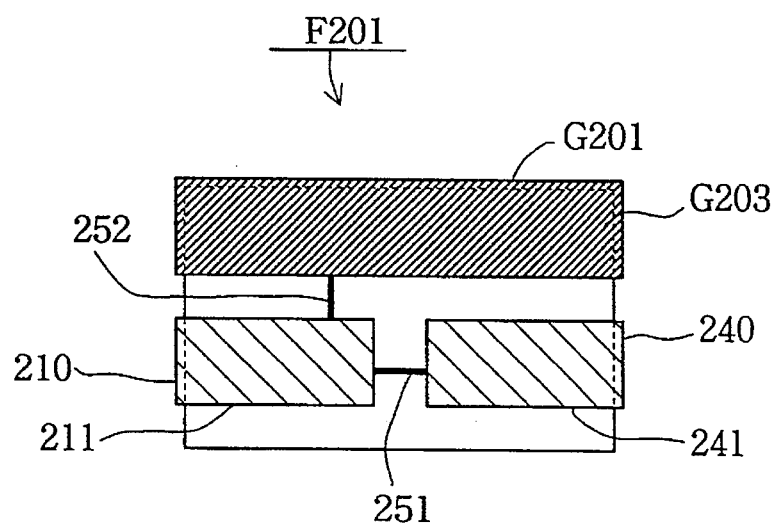

FIGS. 24A and 24B show a multilayer band pass filter F201 which is one embodiment of the present invention capable of providing substantially a uniform film thickness, even when the electrode areas to be electrically plated are different from one another. FIG. 24A is a perspective view of the filter F201, while FIG. 24B is a plan view thereof.

The multilayer band pass filter F201 is formed by printing an electrically conductive paste for forming core conductors L201 and L202 on a green sheet (ceramics before baked), subsequently forming a green sheet, an electrically conductive paste for forming capacitor electrodes 220, 230, and another green sheet in the described order. The resulting deposited assembly is then baked. Finally, necessary electrodes are printed and baked on the surface of the ceramics S forming the filter F201. In other words, an input terminal 210, an extension electrode 211 connected to the input terminal 210, connecting conductors 221, 231, an output terminal 240, an extension electrode 241 connected to the output terminal 240, and ground electrodes G201, G202 and G203 are printed and baked on the surface of the ceramics S. The electrodes are formed by printing a paste of silver-palladium on the surface of the ceramics S with a thickness of about 10 μm.

The surface of the filter F201 includes an electrically conductive small-gage wire 251 positioned between the extension electrodes 211 and 241 in a direct-current manner, and an electrically conductive small-gage wire 252 positioned between the extension electrode 211 and the ground electrode G203 in the direct-current manner. In this embodiment, the electrically conductive paste for forming the extension electrodes 211, 241 and ground electrode G203 is printed while at the same time the electrically conductive paste for forming the small-gage wires 251 and 252 is printed.

As defined in connection with the background art, copper, nickel and tin are electrically plated on the respective electrodes 210, 211, 240, 241, G201, G202 and G203, all which being formed of silver-palladium. More particularly, copper, nickel and tin films (210a, 210b, 211c) are formed on the silver-palladium film 210a corresponding to the input terminal 210. Similarly, copper, nickel and tin films are sequentially formed on the extension electrodes 211, 241, output terminal 240 and ground electrodes G201, G202, G203.

During the process of forming the nickel and tin films in such a manner, all the electrodes 210, 211, 240, 241, G201, G202 and G203, will be plated to form copper, nickel and tin films of uniform thickness when these parts are in contact with the steel balls. Their uniform thickness results from connection between the electrodes 210, 211, 240, 241, G201, G202 and G203 through the small-gage wires 251 and 252 in the direct-current manner.

FIG. 25 shows results from experiments that are carried out for the embodiment of FIGS. 24A and 24B.

As shown in FIG. 25, the input terminal 210 and extension electrode 211 for defining an input terminal part have the same voltage if the small-gage wires 251 and 252 are absent. Similarly, the output terminal 240 and extension electrode 241 for defining an output terminal part have the same voltage, and the ground electrodes G201, G202 and G203 for defining a ground electrode part have the same voltage. The total area of the input terminal part is the same as that of the output terminal part, but the total area of the ground electrode part is about eight times larger than the total area of the input and output terminal parts. If the plating of tin is carried out without the small-gage wires 251 and 252 (as in the background art), the thickness of the tin film at the ground electrode part becomes about five times larger than the thickness of the tin film in the input and output terminal parts.

However, if the plating of tin is carried out after the small-gage wires 251 and 252 have been formed, the difference between the tin film thickness of the input and output terminal parts, and the tin film thickness of the ground electrode part is reduced to about 10%. In other words, the use of the small-gage wires 251 and 252 can make the thickness of the plated films substantially uniform, even if the electrode areas to be plated are different.

Figure 26A:
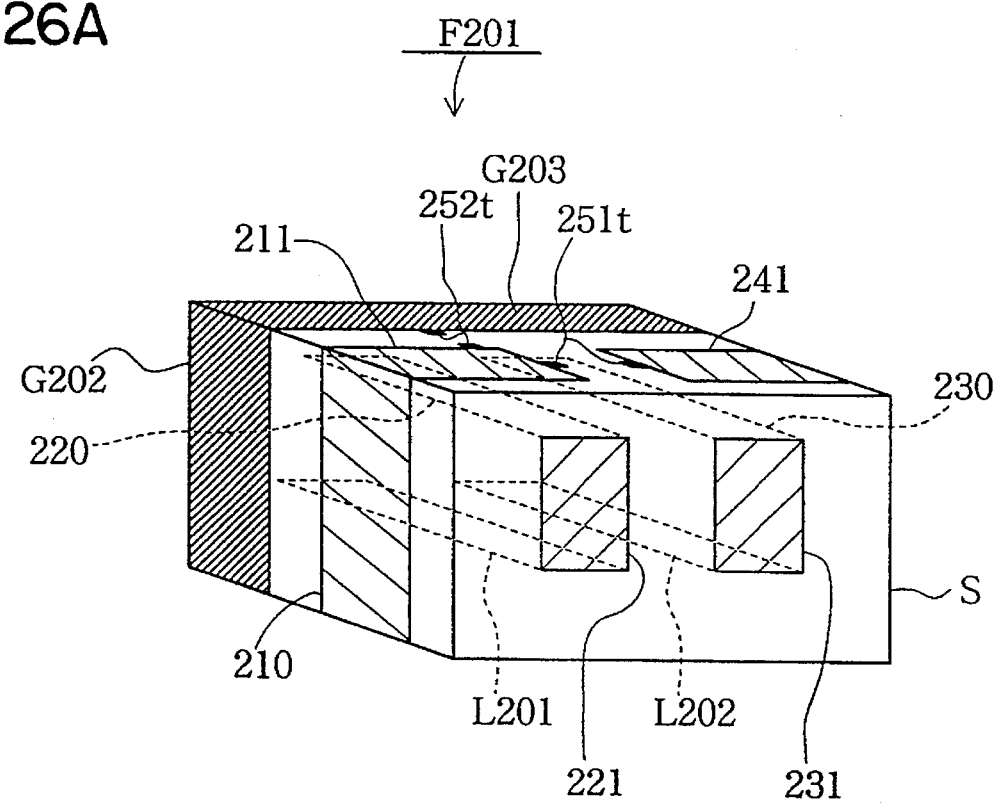
FIGS. 26A and 26B are views showing the embodiment of FIGS. 24A and 24B after the small-gage wires have been trimmed.
Figure 26B:
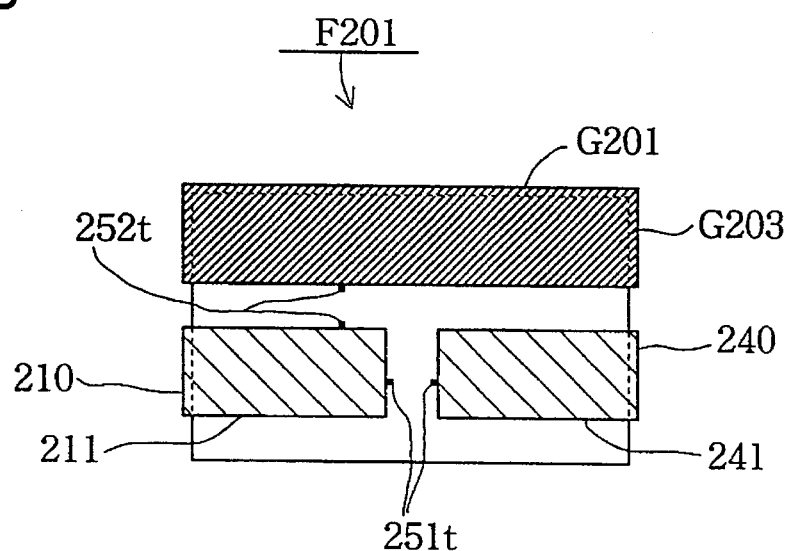

In the embodiment of FIGS. 24A and 24B, the filter F201 is removed after a given time period have elapsed from the start of the electrical plating step. The small-gage wires 251 and 252 are trimmed by any suitable means such as sand blasting. FIGS. 26A and 26B shows the filter F201 after the small-gage wires 251 and 252 have been trimmed. Even after the timing step, wire traces 251t and 252t remain. By trimming the small-gage wires 251 and 252 in such a manner, the extension electrodes 211, 241 and ground electrode G203 become independent from one another in voltage, without damaging the filter performance. When the wire traces 251t and 252t are observed, it can easily be confirmed that the small-gage wires 251 and 252 have been used to make the plated film thickness uniform. Only parts of the small-gage wires 251 and 252 may be trimmed, unlike the manner shown in FIGS. 26A and 26B.

The silver-palladium film of FIGS. 24A and 24B may be replaced by any other conductive film. The nickel film may be replaced by a film of any other material which can improve the heat-resistance in the soldering. The tin film may be replaced by a film of any other material which can improve the soldering property.

The embodiment of FIGS. 24A and 24B is such that a plurality of electrically conductive films, independent from one another in voltage, are printed on the surface of a dielectric forming the filter. The conductive wires are printed to connect the conductive films to one another in the direct-current manner. Any material for improving the heat-resistance in the soldering, or the soldering property, is deposited on the conductive films, and the conductive wires are finally trimmed.

In the embodiment of FIGS. 24A and 24B, the conductive wire 251 for connecting between the extension electrodes 211 and 241 in the direct-current manner, as well as the conductive wire 252 for connecting the extension electrode 211 and the ground electrode G203, are printed at the same time along with priority of the extension electrodes and ground electrode G203. However, the conductive paste for the small-gage wires 251 and 252 may be printed after the conductive paste for the extension electrodes and ground electrode G203 have been printed.

The small-gage wires 251 and 252 may be replaced by thin and conductive wires, or they may be formed into any other configuration by an electrically conductive material, to linearly connect between the electrodes. The small-gage wires 251 and 252 may be trimmed by any suitable means other than the sand blasting, such as laser beam or the like.

Figure 27:
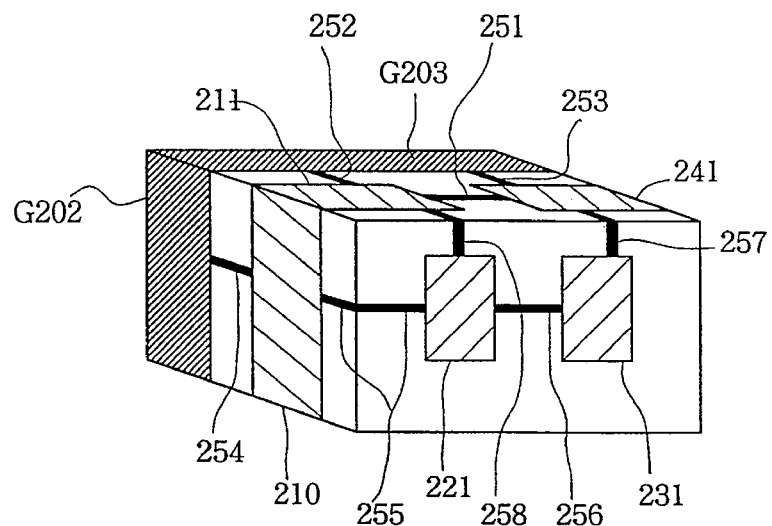
FIG. 27 is a perspective view showing another embodiment of the present invention in which the plated film thickness can be made substantially uniform even if the areas of the electrodes to be electrically plated is different from one another.

FIG. 27 shows a further embodiment of the present invention in which the thickness of plated films can be made substantially uniform, even if the areas of electrodes to be electrically plated are different.

The conductive wires connecting the conductive films in the direct-current manner may similarly be used to connect other conductive films. The conductive wires may be placed on any face of the filter F201, that is, top, side or bottom. More particularly, as shown in FIG. 27, there may be provided a small-gage wire 253 for connecting between the extension electrode 241 and the ground electrode G203, a small-gage wire 254 for connecting between the input terminal 210 and the ground electrode G202, a small-gage wire 255 for connecting between the input terminal 210 and the connecting conductor 221, a small-gage wire 258 for connecting between the connecting conductor 221 and the extension electrode 211, a small-gage wire 257 for connecting between the connecting conductor 231 and the extension electrode 241, and a small-gage wire 256 for connecting the connecting conductors 221 and 231. These conductive wires may be provided on any face in the filter F201 as long as one conductive film is connected to at least one conductive wire.

Figure 28A:
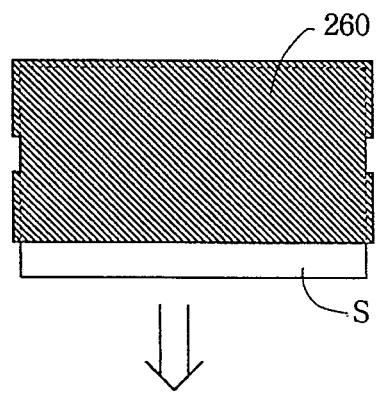
FIGS. 28A and 28B are views showing a further embodiment of the present invention in which the plated film thickness can be made substantially uniform, even if the area of the electrodes to be electrically plated is different from one another, as viewed from the same direction as in FIG. 24A.
Figure 28B:
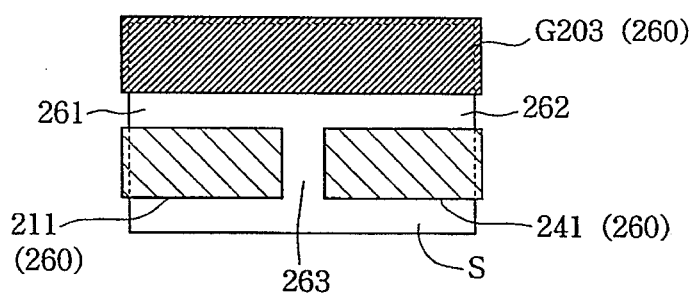

FIGS. 28A and 28B show a perspective view of another embodiment of the present invention in which the plated film thickness can be made substantially uniform, even if the areas of the electrodes to be electrically plated is different from one another. FIG. 28B is viewed in the same direction as in FIG. 24B.

FIG. 28A shows the filter F201 after an electrically conductive film 260 is printed on the surface of the ceramics S as a dielectric forming the filter F201 and a material for improving the heat-resistance in the soldering or the soldering property is deposited on the conductive film 260 through the electric plating. FIG. 28A shows three conductive films into which one conductive film 260 is divided.

More particularly, the conductive film 260 is trimmed, at regions 261, 262 and 263, through laser beam, sand blasting or the like. The trimming divides the conductive film 260 into three conductive film sections. These divided conductive film sections define extension electrodes and ground electrode G203 in the filter F201 as shown in FIGS. 24A and 24B. The conductive film 260 may be divided into two or four or more conductive film sections.

FIGS. 32A–32E show a multilayer band pass filter F301 which is a further embodiment of the present invention of controlling the band width thereof. This figure also shows divided layers S300–S304 in a plan view.

In this embodiment, the layers S300, S301, S303 and S304 are similar to those of the multilayer band pass filter F301, but the second layer S302 of the multilayer band pass filter F301 is replaced by the second layer S302b.

The second layer S302b includes an internal ground electrode 1G7. The central portion of the internal ground electrode IG7 which is not opposite to core conductors L301 and L302 includes a slit 371 formed therein. By adjusting the length of the slit 371, the coupling between two resonators adjacent to each other through the slit 371 can be controlled to regulate the band width in the multilayer band pass filter F3.

If the length of the internal ground electrode IG7 along the longitudinal length of the core conductors L301 and L302 is designated $d_0$, and a non-slit length obtained by subtracting the length of the slit 371 from the length $d_0$ is d, and when the rate of the non-slit length to the length of the internal ground electrode IG7 ($d/d_0$) is changed between 0 and 1, the band width increases as the rate ($d/d_0$) increases. The band width decreases as the rate ($d/d_0$) increases (that is, the length of the slit 371 increases).

Figure 33A:
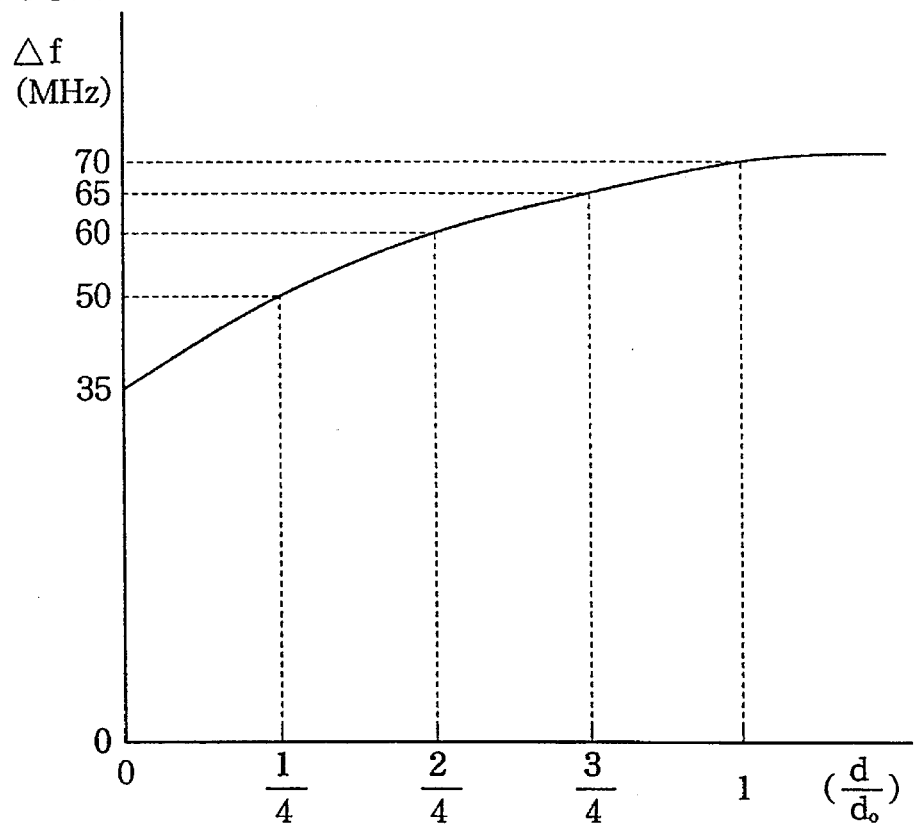
FIG. 33A is a graph quantitatively plotting the relationship between a rate $(d/d_0)$ of a non-slit length to the length of an internal ground electrode IG7 and a band width $\Delta f$ if a multilayer band pass filter.
Figure 33B:
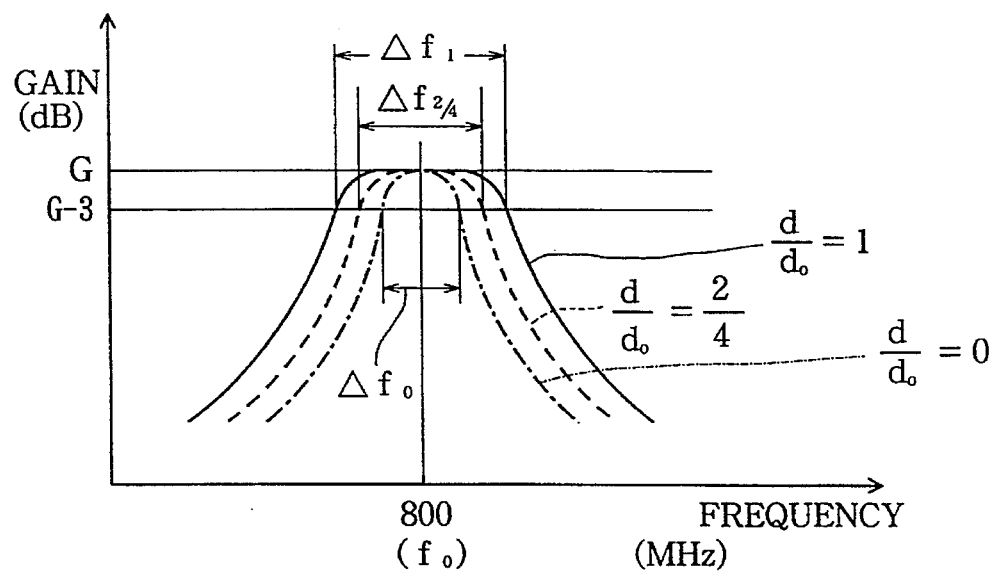
FIG. 33B is a graph showing the frequency characteristics of the band pass filter in which the band width $\Delta f$ changes when the above rate $(d/d_0)$ changes.

FIG. 33A is a graph showing variations in the band width Δf when the rate of the non-slit length to the length of the internal ground electrode IG7 ($d/d_0$) is varied in the multilayer band pass filter F301. FIG. 33B is a graph showing the decreased band width Δf when the rate ($d/d_0$) is changed between 1 and 0. The band width Δf when the rate ($d/d_0$) is defined herein as a width of frequency at a point in which the gain G corresponding to the central frequency $F_0$ in the frequency characteristic diagram is attenuated by 3 dB [(G-3) dB].

In the multilayer band pass filter F301, neither the loss nor the entire configuration of the filter F303 will increase. The band of the multilayer band pass filter F301 can be only controlled. A group of products having different band widths is therefore provided to satisfy various demands.

Figure 32E:
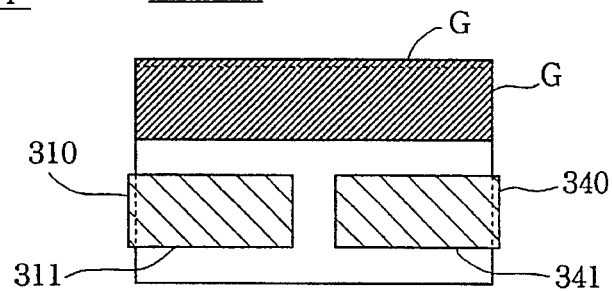
FIGS. 32A–32E are plan views showing layers S300–S304 into which a multilayer band pass filter F303 being a further embodiment of the present invention for controlling the band width thereof is divided.
Figure 32D:
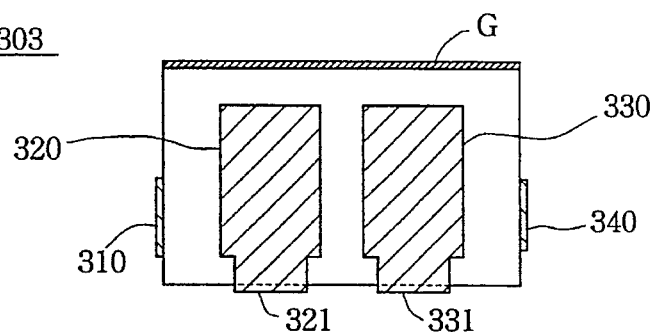
Figure 32C:
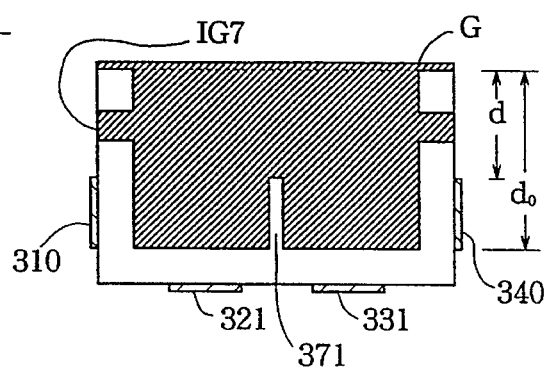
Figure 32B:
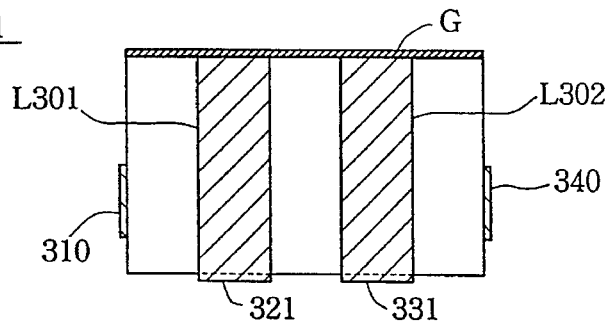
Figure 32A:
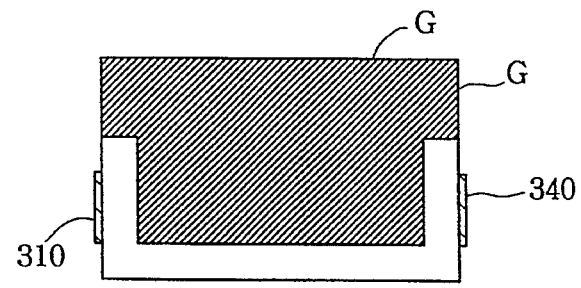

Although the multilayer band pass filter F301 has been described regarding a single internal ground electrode, it may include a plurality of such internal ground electrodes. In this case, capacitor electrodes 320 and 330 are preferably disposed between each pair of adjacent internal ground electrodes. More particularly, another internal ground electrode may be disposed above the capacitor electrodes 320 and 330 in the internal ground electrode IG7 as shown in FIG. 32C. A further internal ground electrode may be provided on the other internal ground electrode. A further internal ground electrode may be disposed below the capacitor electrodes 320 and 330 in the internal ground electrode IG7 as shown in FIG. 32C. A further internal ground electrode may be provided below the other internal ground electrode. If a plurality of internal ground electrodes are provided parallel to one another in such a manner, any internal ground electrode, other than the internal ground electrode to be used for regulating the length of the slit, will have a slit formed therein. The length of such a slit ($d_0$–d) is preferably equal to the length $d_0$. In other words, all the internal ground electrodes, other than the internal ground electrode having a regulated length of the slit, will have slits formed therein. Those slits will be formed along the longitudinal direction in the core conductors L301 and L302. Thus, the band width to be regulated can be greatly variable.

The slit 371 of the multilayer band pass filter F301 is cut from the side of the connecting conductors 321, 331 of the internal ground electrode IG7, or from the lower end thereof, as shown in S302b of FIG. 32C. However, the slit 371 may be cut from the side opposite to the connecting conductors 321 and 331, or from the upper end thereof as viewed in FIG. 32C.

Although the internal ground electrode IG7 of the embodiment shown in FIG. 32C has been described with respect to the slit 371 formed therein, the slit may be replaced by a groove or notch having a desired width. In place of the notch, the internal ground electrode IG7 may include an aperture 350 formed therethrough. The band of the multilayer band pass filter may be controlled by regulating the length of such an aperture 350 which has a length extending in the longitudinal direction of the core conductors L301 and L302.

Although the multilayer band pass filter F301 has been described with respect to two resonance circuits, it may include three or more resonance circuits. In such a case, slits may be formed at regions adjacent to the respective resonance circuits. By regulating the length of each of the slit 371, the bandwidth of each of the resonance circuits may be controlled.

We claim:

1. A multilayer band pass filter comprising:

two input/output terminals;

first and second extension electrodes respectively connected to said input/output terminals;

capacitor electrodes forming first and second input/output capacitors with said first and second extension electrodes, respectively, each of said capacitor electrodes opposing a corresponding one of said extension electrodes through a first dielectric layer;

a core conductor defining an inductor, an open end of said core conductor being connected to one of said capacitor electrodes;

a ground electrode opposing one of said capacitor electrodes to form a resonance capacitor therebetween; and a capacity increasing electrode forming a zero point forming capacitor, said capacity increasing electrode opposing said first and second extension electrodes through a second dielectric layer, at least one of said first and second extension electrodes and said capacity increasing electrode extending to an outer peripheral edge of said multilayer band pass filter.

2. A multilayer band pass filter as defined in claim 1, wherein one of said electrodes for forming said zero point forming capacitor, one of said electrodes for forming said second input/output capacitor, and one of said electrodes forming said resonance capacitor are located on said outer peripheral edge of said multilayer band pass filter.

3. A multilayer band pass filter as defined in claim 1, further comprising a second core conductor defining a second inductor, a second capacitor electrode opposing said ground electrode to form a second resonance capacitor, wherein a multi-stage resonator is formed by said core conductor, said ground electrode and said capacitor electrodes, and wherein resonator sections in said multi-stage resonator are coupled with one another in one of an inductive, capacitive and inductive plus capacitive coupling manner.

4. A multilayer band pass filter as defined in claim 1, wherein a one-stage resonator is formed by said core conductors, said ground electrodes and said capacitor electrodes.

5. A multilayer band pass filter as defined in claim 1, wherein at least one of said first and second extension electrodes are formed on an extension layer, a surface side of said extension layer being exposed to permit access to said extension electrode formed thereon.

6. A multilayer band pass filter as defined in claim 1, wherein at least one of said first and second extension electrodes has two surfaces which are exposed to permit access thereto.

7. A multilayer band pass filter as defined in claim 1, further comprising:

a second core conductor; and a second ground electrode, wherein a multi-stage resonator is formed by said core conductors, said ground electrodes and said capacitor electrodes.

8. A multilayer band pass filter as defined in claim 7, wherein said resonator sections of the multi-stage resonator formed by said inductor and said resonance capacitor are capacitively coupled with one another, and wherein at least one of a pair of electrodes for capacitively coupling one resonator to another, an end of said first extension electrode, an end of said second extension electrode, one of said electrodes for forming said first input/output capacitor, one of said electrodes for forming said second input/output capacitor and one of said electrodes for forming said resonance capacitor are located on said peripheral edge of said multilayer band pass filter.

9. A multilayer band pass filter comprising:

a core conductor defining an inductor and having an open end;

first and second capacitor electrodes, at least one of said capacitor electrodes being connected to said open end of said core conductor;

a ground electrode;

first and second extension electrodes; and a zero point forming electrode, wherein:

said first and second extension electrodes oppose said first and second capacitor electrodes through a first dielectric layer to form first and second input/output capacitors, respectively, said capacitor electrodes oppose said ground electrode through a second dielectric layer to-form resonance capacitors, and said zero point forming electrode opposes said capacitor electrodes through said first dielectric layer to form a zero point forming capacitor.

10. A multilayer band pass filter as defined in claim 9, wherein said first extension electrode, said second extension electrode and one of said electrodes for forming said resonance capacitor are formed on one face of said multilayer band pass filter.

11. A multilayer band pass filter as defined in claim 9, wherein at least one of said first and second extension electrodes are formed on an extension layer, a surface side of said extension layer being exposed to permit access to said extension electrode formed thereon.

12. A multilayer band pass filter as defined in claim 9, wherein at least one of said first and second extension electrodes has two surfaces which are exposed to permit access thereto.

* * * * *